US008745849B2

(12) United States Patent
Maher

(10) Patent No.: US 8,745,849 B2
(45) Date of Patent: Jun. 10, 2014

(54) TEMPLATE FOR A SUPERCONDUCTING COIL

(75) Inventor: Eamonn Francis Maher, Henley on Thames (GB)

(73) Assignee: Coated Conductor Cylinders Ltd., Malvern, Worcestershire (GB)

(*) Notice: Subject to any disclaimer, the term of this patent is extended or adjusted under 35 U.S.C. 154(b) by 1640 days.

(21) Appl. No.: 12/094,940

(22) PCT Filed: Nov. 23, 2006

(86) PCT No.: PCT/GB2006/004377
§ 371 (c)(1),
(2), (4) Date: Nov. 11, 2008

(87) PCT Pub. No.: WO2007/060432
PCT Pub. Date: May 31, 2007

(65) Prior Publication Data
US 2011/0177952 A1    Jul. 21, 2011

(30) Foreign Application Priority Data
Nov. 23, 2005  (GB) ................................ 0524090.8

(51) Int. Cl.
*H01F 6/06*  (2006.01)
*H01F 41/04*  (2006.01)

(52) U.S. Cl.
USPC ............. 29/599; 505/239; 505/410; 505/434

(58) Field of Classification Search
CPC ...... H01F 6/06; H01F 41/048; H01F 39/2454
USPC ............... 29/599; 118/696; 216/13; 335/216; 427/63; 505/100, 160, 170, 239, 410, 505/411, 434
See application file for complete search history.

(56) References Cited

U.S. PATENT DOCUMENTS

| 4,419,178 A | * | 12/1983 | Rode ................................ 117/1 |
| 6,147,033 A | | 11/2000 | Youm et al. |

(Continued)

FOREIGN PATENT DOCUMENTS

| DE | 198 17 390 A1 | 10/1999 |
| WO | 9858415 | 12/1998 |

(Continued)

OTHER PUBLICATIONS

A Goyal et al.: "High critical current density superconducting tapes by epitaxial deposition of YBa2Cu3Ox thick films on biaxially textured metals", Applied Physics Letters, AIP, American Institute of Physics, vol. 69, No. 12, Sep. 16, 1996, pp. 1795-1797, XP012016141.

(Continued)

*Primary Examiner* — Livius R Cazan
(74) *Attorney, Agent, or Firm* — Banner & Witcoff, Ltd.

(57) ABSTRACT

A method is disclosed for making a template for a superconducting coil on a former (25) from a sheet (23) of flexible biaxially-textured material having at least two joining edges, the surface texture of the sheet being defined by a plurality of grains, and the former having a substantially curved surface. The method comprises the steps of shaping the sheet so that each joining edge lies adjacent to another joining edge on application of the sheet to the former, each joining edge and its adjacent edge being a pair of edges, and so that the sheet is dimensioned to cover a part of the surface of the former and substantially to fit that part of the former; positioning the sheet on the former so that regions of the sheet either side of the pair of edges have substantially aligned grains; and forming a join between the pair of edges, the template thereby having a substantially continuous textured surface across the join.

37 Claims, 9 Drawing Sheets

(56) References Cited

U.S. PATENT DOCUMENTS

| | | |
|---|---|---|
| 6,256,521 B1 | 7/2001 | Lee et al. |
| 6,451,450 B1 | 9/2002 | Goyal et al. |
| 6,555,256 B1 | 4/2003 | Christen et al. |
| 2004/0096707 A1 | 5/2004 | Sambasivan et al. |
| 2005/0269021 A1 | 12/2005 | Park et al. |
| 2006/0073978 A1* | 4/2006 | Chason et al. ............... 505/434 |

FOREIGN PATENT DOCUMENTS

| | | |
|---|---|---|
| WO | 2003/019589 A | 3/2003 |
| WO | 2004059041 | 7/2004 |
| WO | 2004/079758 A | 9/2004 |
| WO | 2004105147 | 12/2004 |

OTHER PUBLICATIONS

International Search Report dated Feb. 27, 2007 in Application No. PCT/GB2006/004377.

PCT International Preliminary Report on Patentability dated Oct. 29, 2007 in Application No. PCT/GB2006/004377.

Combined Search and Examination Report in App. No. GB0524090.8 dated Feb. 13, 2006.

* cited by examiner

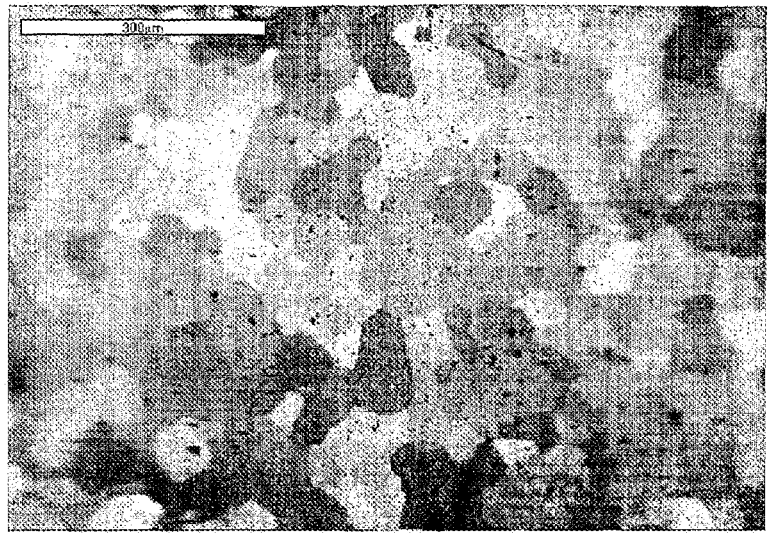
Fig. 1 : Typical SEM micrograph for RABiTS substrate
Fig. 2 : Grain boundaries overlaid on SEM micrograph

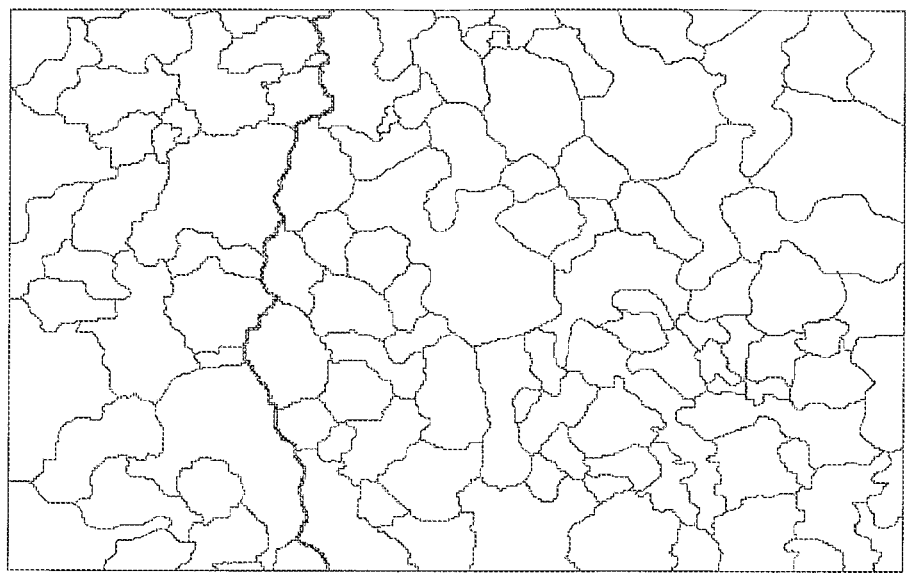
Fig. 3 : Grain boundaries delineated
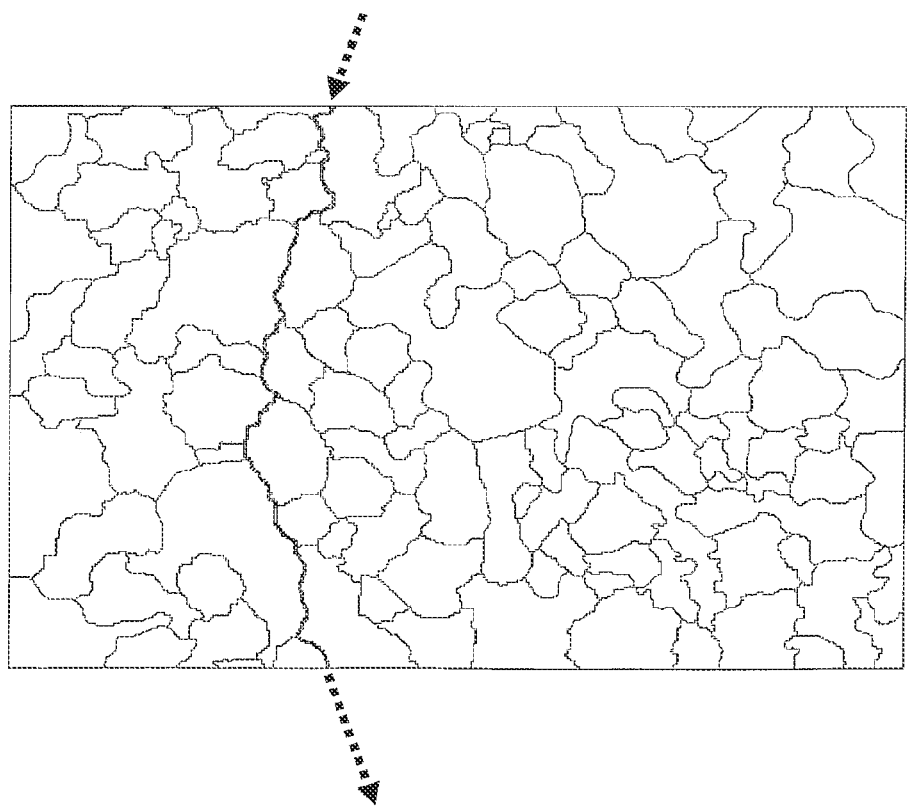
Fig. 4 : Chosen route for edge in bold Fig. 9 : Example of coils for motor or generator

TEMPLATE FOR A SUPERCONDUCTING COIL

This application claims priority of International Application No. PCT/GB2006/004377, filed Nov. 23, 2006.

The present invention relates to a method of making a template for a superconducting coil on a substantially curved former, and to an apparatus for making a template for a superconducting coil on a substantially curved former.

Previously disclosed methods of directly fabricating superconducting coils on a former are described in European Patent Application No. 02755238.9 published on 6 Mar. 2003 and entitled "Superconducting Coil Fabrication". That application discloses a method of fabricating a superconducting coil. The method comprises the steps of fabricating individual coil tracks by depositing, shaping and texturing superconducting material in situ in individual deposited layers on a former which has a substantially curved surface. That application also discloses a number of procedures for creating an initial textured layer on which to form the coil. Those procedures include deposition of a template layer for the subsequent textured superconducting material using, for example, the so-called IBAD (Ion Beam Assisted Deposition), IAD (Ion Assisted Deposition) or ISD (Inclined Substrate Deposition) approaches or variants of these approaches.

In the IBAD deposition method, it is necessary to start with a highly-polished surface and deposit, for example, YSZ (Yttrium Stabilised Zirconia) in the presence of an ion beam impinging on the substrate at a specific angle, which has the effect of inducing texture in the growing YSZ film. In another technique, sometimes referred to as ISD, evaporation or pulsed laser deposition of textured layers is achieved, again at specific angles, but without the need for an ion beam. Schemes using sputtering to produce the required conditions at the surface have also been studied—IAD is one example, Molecular Beam Sputtering (MBS) is another. The aims are always the same: to produce a textured layer on top of which highly superconductive films, of for example YBCO (Yttrium Barium Copper Oxide), can be grown. These films can be fabricated into superconducting coils, by successively depositing alternate superconducting and non-superconducting layers, as described in European Patent Application No. 02755238.9. The configuration of the coil is copied through successive layers. However, a serious defect present in a layer can disrupt the configuration of the coil, such that it may fail a testing step to test whether the coil superconducts.

The known fabrication process has been improved to increase the proportion of working coil tracks fabricated and to improve their superconducting properties. The improvements to the fabrication process are fully described in the European Patent Application No. 04717702.7 entitled "Superconducting Coil Testing". The improvements include mapping the surface of the outermost layer in order to detect defects, choosing a path that avoids the defects and calculating the effect on the desired superconducting field prior to defining the path into or onto the layer in order to create the coil track. The improved method therefore allows the configuration of the coil track to vary between successive layers in the coil.

Another method of fabricating superconducting coils on a former uses a textured flexible substrate, in the form of a tape, such as RABiTS (Rolling Assisted Biaxially Textured Substrate) or suitable variants, wound onto a former. A RABiTS material is produced by successive rolling reduction processes interleaved with heat treatment. The net result is a structure having the desired grain alignment in both the plane of the rolled substrate and in the rolling direction. Therefore, the substrate—which is a tape—is biaxially textured.

The degree of texture can be determined by XRD (X-ray Diffraction) or EBSD (Electron Back Scattering Diffraction). The aim is to produce the best texture, i.e. the least amount of misorientation between the grains by minimising the number of high angle grain boundaries. This is usually expressed both in plane and out-of-plane as a FWHM (full width half-maximum) of the X-ray peak chosen or from the misorientation histogram for the EBSD technique. These are well established procedures.

Note that techniques of forming RABiTS tape have developed to the extent that the grain shape and size can be controlled. For example, RABiTS material with equiax grains can be formed, where the dimensions of the crystal grains are approximately the same in both directions in the "ab" plane of the material. Alternatively, the shape of the grains produced can be anisotropic, so that the degree of grain elongation can be varied. Increased control over all these parameters using such techniques as the introduction of controlled amounts of impurities into the starting material have recently been reported Eickemeyer et al., EUCAS2005 Vienna Austria, 10 to 15 Sep. 2005.

The advantage of starting with an untextured substrate is that the substrate can be mechanically very strong compared with RABiTS and, therefore, thinner. Consequently, the engineering current density can be higher than for a RABiTS coated conductor for the same YBCO film properties. Even though, for these reasons, a RABiTS type material does not create a substrate that is as good as one created using an IBAD technique, it is produced much more quickly and inexpensively.

In fabricating a coil that uses textured tape substrate made of, for example, RABiTS material, the tape to be coated must be well textured, that is to say its structure should be as near to that of a single crystal as possible. The "c" axis of all grains must be aligned in essentially the same direction, close to the normal of the plane of the film deposition, and the number of high angle grain boundaries in the "ab" plane must also be minimised. High angle grain boundaries act as "weak links" or obstructions to the percplative supercurrent of a subsequently deposited superconducting coil, because the texture of the tape is copied through into the subsequently deposited layer. Therefore, such obstructions are to be avoided, as they reduce the super current.

In the coated conductor tape, there are buffer layers between the tape substrate and the superconductive layers. These buffer layers are required to prevent the diffusion of unwanted chemical species between the substrate and the YBCO layer and vice versa.

These buffer layers can be insulating or conducting, and will have lattice parameters and an expansion coefficient reasonably matched to the substrate. Typical buffer layers are cerium oxide (CeO) and YSZ, palladium (Pd), silver (Ag) or any other suitable material which exhibits the physical and physiochemical properties required of the buffer layer. The result is a tape, typically 50-100 microns thick having excellent texture, with the grains having a c-axis pointing generally in the [1,0,0] direction, and having very little in-plane misorientation.

In making the superconducting coils from lengths of coated conductor tape, the geometrical configuration of each coil track is constrained by the geometrical configuration of the tape wound around the former.

An alternative and improved fabrication route can be developed to fabricate a template layer from a sheet of a flexible biaxially textured material on which to deposit in situ a superconducting coil with substantially curved geometry, with an axis of rotational symmetry e.g. cylindrical, in order to optimise the performance of superconducting coils deposited on the former, in situ., and to adapt the configuration of subsequently formed coil tracks and minimising the effect of defective areas.

The aim of the present invention is to provide such an alternative and improved route to fabricate a template from a sheet of a flexible biaxially textured material. This will in many cases necessitate the creation of a join between adjacent edges of the sheet.

In this specification, the following terms, listed in alphabetical order, are intended to have at least the specific meanings as defined here below:

An aligned grain is a crystal grain in the substrate that has its "c" axis essentially the along same direction as other crystal grains in the substrate, and close to normal of the plane of the substrate; and which is also aligned in the "ab" plane. For elongate grains, the elongate dimension of the grains will generally have a preferred crystallographic orientation.

The configuration of a feature of the coil and/or former is the locus of that feature around the coil and/or former, respectively. Thus a configuration of a coil track is the three-dimensional geometry of the coil track, which is specifically the locus of the coil track in the coil, and in the interconnection scheme of the coil track, which might be on more than one layer.

A configuration of an adjacent edge is the locus of the edges created in order to form a join in the sheet therebetween. A configuration of a join is the locus of the join formed in the template.

Copying is the reproduction of the crystallographic texture of the underlying layer, namely, the reproduction of the texture of a template. A copying process is a process that applies such copying.

Defining is the determining of a boundary or extent of a feature in an edge of a template, or a layer, or the delineation of the form of the features of a layer. Defining therefore includes: writing, copying, printing and patterning.

An edge is a line defined in the surface of a sheet.

Elongate grains have a preferred direction with their major dimension in this direction.

Equiax grains are crystal grains in a sheet of material that have similar dimensions in each direction in a plane; they may be of similar size.

A former is a device on which the sheet is dimensioned to fit, and positioned, in order to form a template. With respect to this invention, the former has a substantially curved surface, and preferably an axis of rotational symmetry.

A join is formed between two adjacent edges.

A layer is a single deposition of a film, preferably a thin film, on the surface of the template for the deposition of the initial layer of the coil, or on the surface of the topmost layer on the former for the deposition of subsequent layers of the coil.

A line is a route across a sheet preferably along the boundaries of the crystal grains that substantially minimises the number of crystal grains traversed, or the number of crystal grain boundaries crossed, along which calculations are made in order to choose the optimum edges for forming a join therebetween. To form a join two lines are calculated; thus two lines are selected in order to choose the optimum join. A line is a virtual edge.

A path or coil path is a route around which calculations are made in order to define the best optimised track for the superconducting coil. Thus it is a virtual track.

Patterning is the removing or adding of material in a specific geometry, including the defining of a path in a layer.

Printing is writing in parallel.

A template is made from a sheet of flexible, biaxially-textured metallic substrate that is used in the fabrication of a superconducting coil by depositing a material in-situ.

Texture is the physical appearance in terms of roughness and shape of surface features; in microscopical examination it relates to microstructural features such as grain shape, distribution of phases, grain boundary characteristics and crystallographic orientation, i.e. the statistical variation in crystallographic orientation (FWHM). It is, more specifically in this application, crystallographic texture or preferred crystallographic orientation. In relation to superconducting materials, the texture of a sample of superconducting material is indicative of the superconducting properties of that sample. Generally, the texture of a material, such as the texture of a thin film superconductor, is detected, for example, by way of x-ray or electron diffraction, but other methods exist for example optical microscopy.

Texturing in the context of a template made from a RABiTS type sheet is achieved by thermo-mechanical methods, or in the case of an initial layer, it is the growing of a textured thin film.

A track is a coil path defined into a superconducting layer.

A turn is a single loop around a former having a substantially curved surface.

A weak link is a feature in a superconducting layer that would impede a percolating supercurrent. A superconducting track incorporating a weak link tends to fall below a threshold value for a physical property that is indicative of the superconducting properties of the track. Features in the template giving rise to weak links include high angle grain boundaries in the "ab" plane.

A winding is a coil track formed in a patterned single layer and, in the context of this specification, it is not formed by a physical winding process.

Writing is geometrically, locally defining a path or a track, by the laying down or removal of material. Writing can include: etching, scribing and lithographic methods.

In a first aspect of the invention there is provided a method of making a template for a superconducting coil on a former from a sheet of flexible biaxially-textured material having at least two joining edges, the surface texture of the sheet being defined by a plurality of grains, the former having a substantially curved surface, the method comprising the steps of i) shaping the sheet so that: a) each joining edge lies adjacent another joining edge on application of the sheet to the former, each joining edge and its adjacent edge being a pair of edges; and b) the sheet is dimensioned to cover a part of the surface of the former and substantially to fit that part of the former; ii) positioning the sheet on the former so that regions of the sheet either side of the pair of edges have substantially aligned grains; and iii) forming a join between the pair of edges, the template thereby having a substantially continuous textured surface across the join.

Advantageously, the template having a continuous textured substrate can be made at low cost from a flexible textured sheet of material, such as RABiTS. The template can be dimensioned to fit the former; and the join formed between adjacent edges is such that the orientation of the crystal grains either side of the join are similar. This, therefore, ensures that the texturing is substantially continuous across the join. Thus, this gives all the benefits of the alternative type of textured substrate having a curved (i.e. cylindrical) surface made using, for example, IBAD, and ISD techniques, to improve known superconducting coil fabrication processes, thereby increasing the proportion of working coil tracks fabricated by the fabrication process, improving their superconducting properties and enabling coils subsequently formed on the template to be configured according to the characteristics of underlying coils and the intended application. Advantageously, in making a track in a subsequently deposited layer: defects can be detected and located; the defects can be identified as being repairable; the repairable defects can be repaired; a path for the track that avoids the irreparable defects can be chosen; the chosen path of coil track can be amended to adapt the magnetic field that would be produced by the track, if the path is subsequently defined in the layer, so that it produces a predefined magnetic field; the chosen path can be selected to rectify the shape of the magnetic field produced by tracks formed in underlying layers; and the path can be defined into or onto the layer in order to create the coil track. Preferably, the material used to make the template is a foil.

The grains may be substantially flat, crystal grains with mutually low-angled grain boundaries that have a crystalline c-axis substantially normal to the surface of the material and that the sheet is only one grain thick. Preferably the crystal grains are elongate and mutually aligned. The elongate grains may be mutually aligned both in and out of the plane. Alternatively, the crystal grains are equiax, being mutually aligned both in and out of the plane. The equiax grains may be of similar size.

Preferably the method further comprises the step of probing the surface of the sheet for a physical property of the material comprising the sheet in order to detect variations in the physical properties in the sheet. The defects on the sheet can be located before or after the sheet is fitted to the former. Preferably, the defects are detected when the sheet is mounted on the former.

The step of probing of the surface may be restricted to the area of the surface in the regions of the edges. Advantageously, only that part of the sheet used for selecting the join need be scanned, thereby saving time that would otherwise be spent scanning the whole sheet and ensuring the probing step is quick and effective.

The probing step can comprise a plurality of probing steps, a different physical property of said material being probed during each probing step. Advantageously, several physical properties of the sheet can be probed enabling more defects to be located and identified in the region of the join.

The or each probing step preferably provides a data set of a physical property of the sheet, each data set being processable to form a respective map, having features indicative of variations in the respective physical property over the sheet. Advantageously, the relative position of a certain defect can be observed by an operator, for example, by using a microscope with a video-camera.

Each map might be combined with one or more of the other maps to provide a composite map. Preferably, each map is weighted relative to each other map when combined to provide the composite map. Advantageously, the relative position of different types of defects can be observed by using one such composite map, for example, by colour coding the different types of defect.

The step of shaping the sheet may comprise the step of calculating the optimum dimensions of the sheet, so that variations in the physical properties of the sheet, that are indicative of defects and may subsequently give rise to weak links, are substantially minimised in each of the pair of edges and in the regions of the sheet near the join, and in the step of shaping the sheet is shaped to the optimum dimensions. Advantageously, problem areas can be avoided and the maximum percolative current can be achieved in the subsequent coil tracks.

The step of shaping the sheet may comprise the step of calculating an optimum line for each edge so that the lines of the pair of edges cooperate, each line traversing substantially the minimum number of grains, and, in shaping the sheet, each edge is defined by a line.

The method may further comprise the step of calculating the optimum position of the sheet so that the grains at the edges of the pair of edges are substantially aligned, and the step of positioning the sheet may further comprise, applying the sheet to the former in the optimum position.

The method may further comprise the step of calculating the direction of a track to be formed in a subsequently deposited layer, so that the track substantially aligns with the orientation of the major axis of the grains. Advantageously, the percolating current in the subsequently formed track is the substantially optimised. Also, the crystalline structure, and surface texture, of the template may be selected to best suit the intended purpose of a superconducting coil subsequently formed on the template.

The calculation steps may follow an iterative process. Advantageously each parameter, i.e. dimension, line and position, is calculated by way of a series of calculating steps to derive its optimum value.

The method may further comprise the step of abandoning the whole of or part of the sheet if the variations in the physical properties of the sheet are indicative of too many defects being present in the whole or that part of the sheet for the sheet to provide an template. Advantageously, the template or a part of it that would not produce an effective template can be abandoned before the subsequent superconducting layers and buffer layers are deposited.

Preferably, in the step of joining, preferably by a thermomechanical process, a combination of pressure and heat treatments are applied to the sheet, whereby the regions of the sheet near the adjacent edges are secured to each other to form the join.

Preferably, regions of the sheet near the adjacent edges overlap, and the joining step includes perforating the regions of the sheet near the adjacent edges to define the line in the sheet to shape the joining edges by cutting through the overlapping regions. Advantageously, perfect mating of both edges is ensured.

Regions of the sheet near the adjacent edges may overlap and the joining step may include a chemical, plasma, or ion-beam etching or electroforming process to etch the overlapping regions. Advantageously, this treatment would suppress the step formed at the join, thereby smoothing the surface across the join.

The method, preferably, further comprises the step of fusing the edges together by annealing and/or heat treatment to form the join and thereby improving the quality of the join by repairing defects present.

The joining step might further include a doping step, thereby further improving the quality of the join by modifying the grain boundaries. Preferably the doping step includes a controlled introduction of calcium or oxygen, or both, at the join.

The method may further comprise the step of probing the regions of the template either side of the join to assess the quality of the join. Advantageously, this is a quality control step after the joining step to further optimise the join.

The method could further comprise a repairing step during which the sheet undergoes a treatment to improve the quality of the join. Advantageously, defects in the sheet in at least the region of the join can be repaired.

The treatment may include annealing and/or doping and/or thermo-mechanical treatment.

The treatment may also include depositing at least one buffer layer on the template. Advantageously, the treatment includes the deposition of more than one buffer layer to improve the crystallographic texture. A thicker buffer layer would provide a smoother surface, outgrowing any defects present.

In the step of shaping the sheet, at least one of the pair of edges is crenated, thereby maximising the percolation current around the subsequently deposited coil. Advantageously, the contact between generally parallel grains either side of the join is maximised. The crenations may be dentations that may be similar, irregular, regular, periodic or aperiodic, or a combination of these feature. They may be serrations, crenulations, crenallations, castellations or a combination of these features.

Preferably, both edges of the pair of edges are crenated and they interlock.

The crenations along the pair of edges may each have a dovetail configuration with each crenation being dovetail-shaped, the edges of the pair of edges being mutually-interlockable. Preferably, each crenation is substantially larger than the size of the grains present in the sheet. Preferably, each crenation substantially is less than the width of a track formed in a subsequently deposited layer. Advantageously, the join takes advantage of grain elongation, minimising the number of adverse misorientated grain boundaries and their area of overlap, as well as simultaneously maximising the cross-sectional area of the interface of the advantageously grain boundaries that are generally mutually aligned.

Preferably, the dimensions of the crenations are greater than the grain size, but considerably less than the width of the track formed in a subsequently deposited layer.

The pair of edges may meet to form a join along a longitudinal axis of the former to maximise percolation current through the subsequently deposited coil.

Advantageously, significant inhomogenities that could develop in the produced magnetic field produced by subsequently overlaid superconducting coils are prevented by distributing the join around the surface of the cylindrical sheet.

The join may pass substantially around the circumference of the former.

Preferably, the method further comprises placing the sheet around the former with elongated crystals grains substantially in the direction of the turns of a subsequently-deposited coil. Advantageously, the main direction of the grains lie parallel to the direction of the turns of the coil, i.e. that is aligned with the direction of the current flow.

The material used to make the sheet may be made of a RABiTS material. Advantageously, this process produces materials that have the properties required for using the claimed method.

Preferably the former has an axis of rotational symmetry. The former may have a closed surface. The former is, more preferably, cylindrical. Advantageously, this facilitates the deposition of subsequent layers, ensuring uniformity of the deposition process and facilitating the defect mapping process.

In the joining step an electrical shunt might be formed between the edges of the pair of edges. Advantageously, when a join of poor quality is formed, the shunt can be used to enable a functioning coil with tracks crossing the join to be formed on the template; otherwise, a functioning coil would not be able to be fabricated in situ. Preferably, the shunt is made of gold or silver. The shunt can be deposited by any of a number of techniques, that includes placing a connecting wire interlinking together the pair of edges, or depositing an interlinking thin film between the edges.

In the step of positioning the sheet on the former, the regions either side of the pair of edges may overlap.

In a second aspect of the invention there is a method of making a multi-component template for a superconducting coil on a former from at least two sheets of flexible biaxially textured material, each sheet having a plurality of edges, the features of each sheet being defined by a plurality of grains, the former having a substantially curved surface, the method comprising the steps of: 1) shaping each sheet to cover a part of the surface of the former; 2) positioning and securing each sheet on the surface of the former at a pre-selected location with respect to the or each other sheet, the grains of each sheet being mutually aligned and having a predetermined orientation with respect to the alignment of the grains of the/each other sheet.

The method may further comprise the step of calculating the shape of the sheet and the pre-selected location of the sheet on the former.

In a third aspect of the invention there is a method of joining at least two lengths of tape together, i.e. a splicing operation, each length of tape being made of flexible biaxually textured material and having a joining edge, the texture of the tape being defined by a plurality of substantially orientated grains, each joining edge lying adjacent a joining edge of another length of tape, each joining edge and its adjacent edge being a pair of edges, the method comprising the steps of: a) choosing an optimum line near each edge of the pair of edges so that the lines of each edge of the pair fit with each other and each line minimises the number of grains traversed; b) shaping each tape by defining each line to form a joining edge; c) positioning the edges of the pair of edges together and joining the edges of the pair of edges therebetween. Preferably the grains are substantially mutually orientated.

In a fourth aspect of the invention there is a method of making a template for a superconducting coil on a former from a sheet of flexible biaxially-textured material having at least two edges, the surface texture of the sheet being defined by a plurality of grains, the former having a substantially curved surface, the method comprising the steps of: i) shaping the sheet so that: a) each edge lies adjacent another of the edges on application of the sheet to the former, each edge and its adjacent edge being a pair of edges; and b) the sheet is dimensioned to cover a part of the surface of the former and substantially to fit that part of the former; and ii) positioning the sheet on the former so that regions of the sheet either side of the pair of edges have substantially aligned grains, the template thereby having a substantially continuous textured surface between the pair of edges.

In a fifth aspect of the invention there is a computer program or a suite of computer programs arranged such that when executed by a computer it/they operate the computer to control the apparatus to perform the method of at least one of the first to fourth aspects of the invention.

In a sixth aspect of the invention there is provided a computer readable storage medium storing the computer program or at least one of the suite of computer programs of the fifth aspect of the invention.

In a seventh aspect of the invention there is an apparatus for making a template of a superconducting coil of a former from a sheet of textured material, having at least two edges, the apparatus being arranged to carry out a method according to the first aspect of the invention.

In a eighth aspect of the invention there is apparatus for making a template of a superconducting coil on a former from a sheet of a flexible biaxually textured material, having at least two joining edges, the texture of the sheet being defined by a plurality of grains, the apparatus comprising: i) a former for supporting the sheet during manufacture of the template, the former having a substantially curved surface; ii) a computer connected to the former, the computer having a processor that is arranged to control the movement of the former; iii) a shaper for shaping the sheet on the former, the shaper being connected to the processor, the processor being arranged to control the shaper to dimension the sheet so that, on application of the sheet to the former: a) each joining edge lies adjacent another joining edge, each joining edge and its adjacent edge being a pair of edges; and b) the sheet is dimensioned to cover a part of the surface of the former and substantially to fit that part of the former; iv) a positioner for forming the sheet on the former, the positioner being connected to the processor, the processor being arranged to control the positioner so that regions of the sheet on either side of the pair of edges have substantially aligned grains; and iv) a joiner for joining a join between the pair of edges, the joiner being connected to the processor, the processor being arranged to control the joiner to form the join between the edges of each of a pair of edges, the template thereby having a substantially continuous textured surface across the join.

The sheet may comprise a plurality of substantially flat, elongate, mutually aligned crystal grains with mutually low-angled grain boundaries that have a crystalline c-axis substantially normal to the surface of the material, and the sheet is only one grain thick.

Preferably, the apparatus, further comprises a probe for probing the surface of the sheet in the region of the edges, the computer further comprising a memory, the probe being connected to the processor and memory, the processor being arranged to: 1) control the probe; 2) receive signals from the probe which the computer converts into a map of the probed surface of the sheet; 3) store the map in the memory; 4) calculate the optimum dimensions of the sheet thereby maximising the percolation current in a subsequently overlying superconducting coil; and 5) control the shaper to dimension the sheet to the optimum dimensions.

The processor may be further arranged to calculate an optimum line for each edge of the pair, so that, once formed, the edges of the pair of edges cooperate, and the edges traverse substantially the minimum number of grains, and to dimension the sheet by defining the line in the sheet to form each joining edge.

The processor may be further arranged substantially to optimise the percolating current in a track to be formed in a subsequently deposited layer by calculating the direction of the track substantially to align with the orientation of the elongate dimension of the grains. Advantageously the crystalline structure, and surface texture, of the template may be selected to best suit the intended purpose of a superconducting coil subsequently formed on the template, taking into account its specific geometry.

The processor may be further arranged to calculate an optimum position for the sheet so that the grains at the edges of a pair of edges are mutually aligned, and to control the position of the sheet in the optimum position on the former.

The apparatus may further comprise a repairer for repairing the defects present in, and around, the join, and for improving the quality of the join, the repairer being connected to the processor, the processor being arranged to control the repairer in order to repair the surface of the sheet.

The repairer may be arranged to deposit at least one buffer layer on the template, when operated by the processor, thereby improving the microstructure and texture of the material of the template in the vicinity of the join.

The repairer, when operated by the processor, may be arranged to anneal, dope or thermo-mechanically treat the join, thereby removing defects present in the template.

The joiner may include a thermo-mechanical applicator which, when operated by the processor, is arranged to apply compression and heat to the regions of the sheet near the pair of edges, thereby forming the join therebetween. Preferably, the thermo-mechanical applicator comprises a roller and a heater.

The joiner may include a cutter or an etcher which, when operated by the processor, is arranged to perforate the overlapping regions of the sheet simultaneously, and an annealer which, when operated by the processor, is arranged to anneal, heat treat and/or dope the regions of the sheet near the adjacent edges to form the join therebetween.

In a ninth aspect of the invention there is a former for use in the apparatus according the eighth aspect of the invention, wherein the former is resiliently deformable, whereby, on joining the edges of each pair of edges, the former resiliently deforms so that the surface of a template on the former is substantially smooth and continuous. Preferably, the former is resiliently deformable in the region of the join.

In a tenth aspect of the invention there is a former for use in the apparatus according the eighth aspect of the invention, wherein the former has a depression that is arranged to underlie the regions of a sheet which overlap on application of the sheet to the former, the depression thereby accommodating the overlapping regions so that the surface of the template is substantially smooth and continuous. The depression may be a slot.

Preferably, the depression or slot is bevelled at the location of the join. The depression or slot allows excess material in the region where the adjacent edges meet, to extrude into the depression or slot.

Preferably, the former is resiliently deformable, whereby, on joining the edges of each pair of edges, the former resiliently deforms so that the surface of a template on the former is substantially smooth and continuous.

In an eleventh aspect of the invention there is a template for forming a superconducting coil by deposition thereon in situ, the template having a substantially curved surface, wherein the template has a substantially continuous textured surface, the texture of the template being defined by a plurality of grains, and the grains being substantially aligned.

The template may further comprise a join formed between a pair of edges, the region of the template either side of the join having substantially aligned grains and having a substantially continuous textured surface across the join.

In a twelfth aspect of the invention, there is a template made according to any of the first to fourth aspects of the invention.

In a thirteenth aspect of the invention, there is a superconducting device comprising a template according to the eleventh or twelfth aspects of the invention, wherein the superconducting device has a coil comprising a track, the coil being located on the template.

The superconducting device may be a motor, a resistive fault current limiter or a generator, and the template may comprise elongate grains. Preferably, the elongate grains are substantially aligned with the track. Advantageously, aligning the track direction with the major axes of the crystal grains to optimise the percolating current through the track.

The superconducting device may be a inductive fault current limiter, preferably an inductive fault current limiter, and the template may have equiax crystal grains. Preferably, the equiax grains are of substantially similar size. Advantageously, the equivalence of the major axes of the crystal axes of the equiax grains enables the fault current limiter to provide effective screening around a current carrying element.

The device may comprise a concentric series of templates.

In a fourteenth aspect of the invention, there is a system comprising one of more superconducting devices according to the twelfth aspect of the invention.

In the method of fabricating a template layer that has a substantially curved surface and that is disclosed herein, the template is made from a sheet of a flexible biaxially textured material. The surface texture of sheet is defined by crystal grains, and the sheet is preferably made of a RABiTS material. The sheet is shaped to fit a former to have at least two of its edges adjoining each other. The sheet is positioned on the former so that the crystal grains in regions either side of the edges are substantially aligned. The edges are then joined, preferably by a thermo-mechanical method, so that the template has a substantially continuous textured surface across the join.

In order to locate the crystal grains, the sheet is scanned, and a map is formed from the scanning. Since only the crystal grain structure in the region of the edges is required, only these regions might be scanned. The map of the scanned parts of the sheet show the location of the crystal grains. The map can then be used to choose lines in the sheet at which to form the edges of the sheet than are to be joined. The lines are chosen so that the lines fit each other on forming the join, the minimum of crystal grains are cut when forming the edges, the percolating current in a track formed in a subsequently deposited layer is substantially optimised, and so that the sheet can fit the former that is to be used to make the template.

To maximise the quality of the join, the lines are crenated, where the crenations are larger than the size of the crystal grains, and smaller than the width of a track subsequently formed on the template. To optimise substantially the percolating current through a subsequently formed coil track, the crenations are shaped to substantially minimise the proportion of the join, once formed in the template, that lies perpendicular to the direction of the super current through a subsequently formed superconducting coil. Also, the cross-sectional area of the interface between the crystals in the join having a component of direction in the join that is parallel to this super current is substantially maximised. One preferred shape of crenation that achieves this is an interlocking dovetail configuration.

The crystal grains can be of any shape, but for specific superconducting components in which the template is used, specific shapes are preferred, for example mutually aligned, elongate grains or equiax grains. The elongate crystals are preferred for templates used to make resistive fault current limiters, generator and motor coils. The equiax components are preferred in templates for making inductive fault current limiters.

Once the template has been formed, it is scanned to assess its quality. If it is of poor quality, it can be repaired, if required, by "wallpapering" with a buffer layer, or by forming an electrical shunt across the join. Then a superconducting coil can be created, in situ., on the curved surface of the template using thin film deposition techniques. The performance of superconducting coils deposited on the former can be optimised, and the configuration of coil tracks formed in the coil be adapted, as the coil is made.

The invention will now be described in greater detail, by way of example, with reference to the following figures, in which:

FIG. 1 is a image of the surface of a sheet of RABiTS material produced using a scanning electron micrograph;

FIG. 2 shows the grains of FIG. 1 and the outline of their grain boundaries;

FIG. 3 is a representation of the grain boundaries shown in FIG. 2;

FIG. 4 shows a selected line that passes along some of the grain boundaries shown in FIG. 3;

Figure 5:
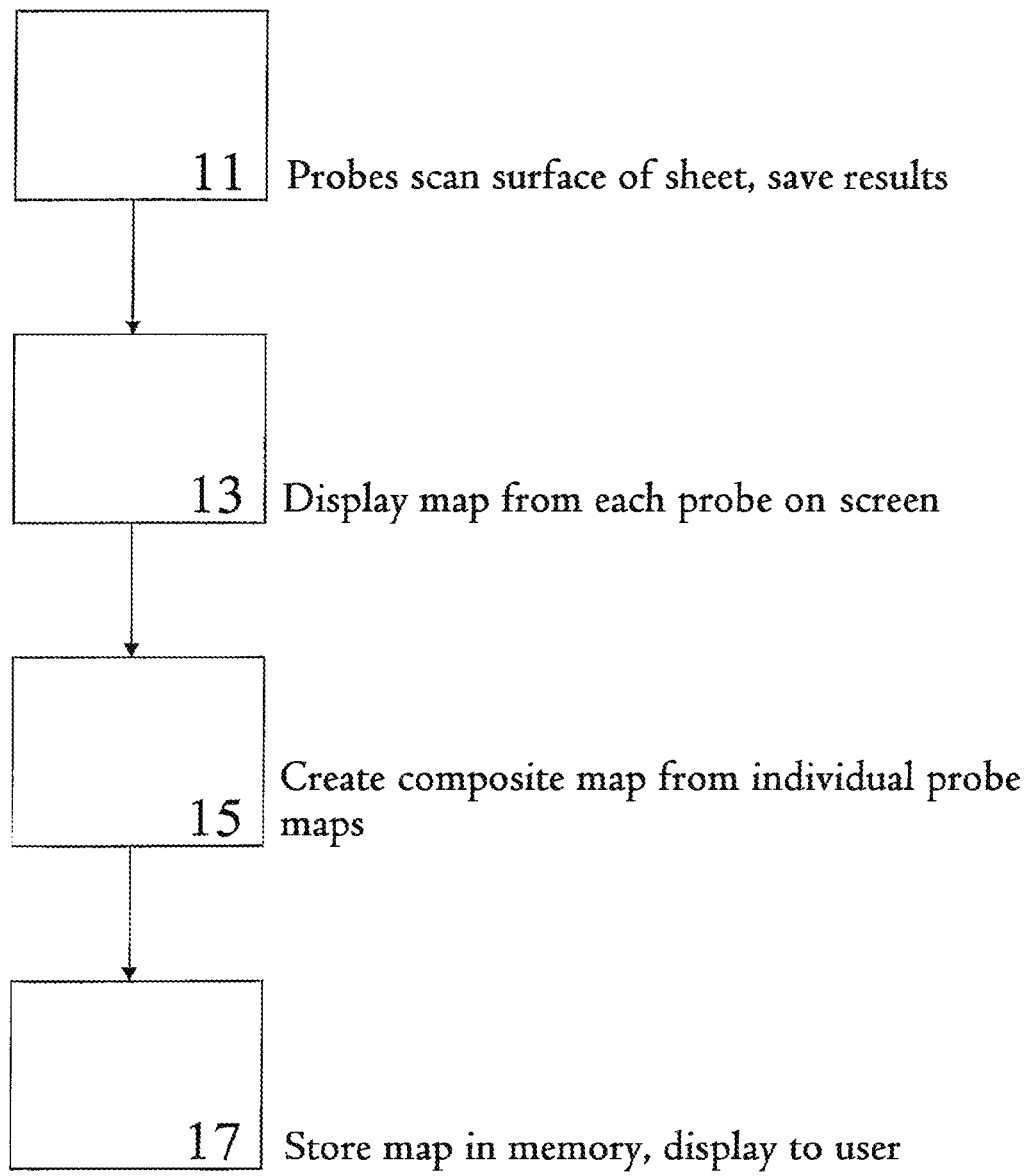
FIG. 5 is a flow diagram of a mapping process.

Referring to the drawings, FIG. 1 a image of the surface of a sheet of RABiTS material produced using a scanning electron microscope. A similar image could be made using an optical technique. It shows the crystal grain boundaries. The relative contrast of the individual grains indicate the variation in relative orientation between the grains. The grain boundaries are more clearly delineated in FIG. 2, where the relative contrast of the grains is shown with the grain boundaries, and in FIG. 3 which shows the configuration of the grain boundaries alone. Note that the grains are elongate along the minor axis of the image.

A sheet of flexible biaxially textured material, such as a sheet of RABiTS material, has two edges which will lie adjacent to each other on a cylindrical former. The sheet is dimensioned so that it can be fitted to the former. The former has a bevelled depression in its surface generally parallel to the axis of the rotation of the former. The sheet is dimensioned so that, when it is fitted to the former, one of the adjacent edges of the sheet overlaps the other edge above the bevelled depression. The former can be adjusted to facilitate the fitting of the sheet to it.

The former is introduced into a joining device which is connected to, and operated by, a computer having a processor. Joining the adjacent edges of the sheet can be made by a number of processes, and the joining device is adapted to carry out any of these preferred processes. Each process intends to achieve the same aim: to preserve the highly-textured features across the join formed between the two adjacent edges of the sheet. Thus the elongated textured grains of one edge are fitted with the elongated grains of the opposite edge. For example, as shown in FIG. 4, a line 1 has been made across the sheet generally along the grain boundaries a first region of the sheet 3. The line 1 generally matches the conformation of a second line in a second region 5 of the sheet. The conformation of the lines have been defined into the sheet to form a first edge and a second edge. As shown in FIG. 4, the two edges fit each other.

One preferred process uses a combination of pressure and heat treatments, whereby the region of the sheet near one edge is welded on to the region of the sheet near its adjacent edge. The bevelled depression located underneath the overlap of the sheet minimises the raised surface caused by one region of the sheet overlying another region. The joining device used to carry out this process comprises a series of rollers and heaters which are applied to the sheet in the region of the adjacent edges to be joined in order to form the join therebetween.

A second preferred process is a cutting process which results in perforating both regions near the adjacent edges to stamp through, or cut through, the two overlapping regions of the sheet individually, or simultaneously. The joining apparatus has a mechanical cutter, a mechanical stamper, a laser or an electron beam to carry out the cutting or stamping. After, the regions of the sheet near the adjacent edges are cut or stamped, they are annealed, pressure-welded or heat-treated to fuse the adjacent edges together to form the join.

Where the overlapping regions are cut individually, a sacrificial layer might be placed under the uppermost region. The uppermost layer is cut or stamped. It is then folded back, and another sacrificial layer is placed under the lower region. The lower region is cut or is stamped. The uppermost region is then pressed into the lower region to form a join, the two regions having a small overlap.

The annealing may also include a doping step. The doping, annealing and heat treatments are intended to improve the quality of the join by repairing any defects present. Typically, the annealing is carried out in combination with the doping process.

A third preferred process is essentially the same as the second process, except the cutting step to form the adjacent edges uses a chemical etching or electroforming process. The joining device correspondingly, has an electrochemical-etching chamber to carry out this "etching" step.

As the aim is to preserve the highly-textured features across the join, achieving this aim is dependent upon the nature and the geometry of the grains either side of the join. Some grains, if situated at an edge, are suitable for making a join, others are not. Furthermore, it is preferable to remove other grains from the sheet before making the template, or shell, from the sheet; that is, to abandon that part of the sheet in which they are located. Therefore, it is greatly advantageous to "map" the crystal grain structure of the sheet to choose the optimum location of a join and the edges from which it is formed. Mapping techniques are fully described in European Patent Application No. 04717702.7 entitled "Superconducting Coil Testing", which is referred to above.

Mapping is carried out in a probing chamber that comprises various probes in order to probe each point of the surface of the sheet or of the chosen region of the sheet. Each probe is controlled by the processor. Some of those probes are controlled by the processor to emit a probing beam. Each probe is fixed relative to the chamber. The former on which the layer is located is rotated and translated on its axis relative to the chamber and to each probe, providing relative movement between the layer and the stationary probe. Thus, each point on the surface of the layer is probed by the probes. Each probe scans the surface of the sheet of the selected parts of the sheet, interrogating the surface for a different physical property. This probing method evaluates the properties of a spatial area of the sheet, or selected parts thereof. The parts of the sheet selected for probing and for calculating an optimum line can be, for example, those parts of the sheet in which edges can be defined so that, when the shaped sheet is fitted and is wrapped around a former, the edges of the sheet meet to form a join.

Data collected by a probe is converted into a map which can be displayed to an operator on a screen, or to an expert system. The resolution of the map of the layer, showing the features representing the variation of physical properties detected in the selected regions of the sheet, is dependent, for each different property, upon the resolution of the corresponding probe, i.e. probing beam. Ideally, the detail of the map should be sufficient to define the line of the edges to be joined. Crucially, for the map to be of much assistance in calculating preferred optimised lines for the adjacent edges and the join, the resolution of the map must be sufficient to represent features of the crystal grain structure, the grain boundaries and the texture of the surface of the sheet. Also, the resolution of the map must be sufficient for calculating an optimal line of the subsequently overlying tracks. Therefore, as the resolution of the map is dependent on the resolution of the probing beam, the width of the probing beam must be significantly narrower than the width of the track in overlying layers.

Some properties of the sheet that are probed include: layer texture, surface roughness, and optical properties. The probes which can be used include electromagnetic radiation—such as X-rays or light, including IR and UV—and various particle beams such as electron beams and ion beams. The probing chamber also comprises at least one detector, or at least one array of detectors, for each type of probe. Each detector is connected to a processor by means of an input, and transmits a signal to the processor on detection of an event, the processor storing in a memory the information carried by the signal. The processor processes and directs the signal for display on a screen, thereby providing a real time display of the signal as a map of the sheet. The processor is also connected to the various probes, each of which it operates. Where different probes are operated simultaneously, the signals of each can be displayed on the screen simultaneously.

The probing techniques measure one or more properties of the sheet: for example the texture, the composition and other physical properties. Some techniques suited to probe the texture of the layer use: X-rays, optical wavelengths of light, ion beams or electron beams. For each of these, it is ideal to have a stationary beam impinging on the surface at an 'appropriate angle', with the stationary detectors for reflected or diffracted beams positioned at appropriate angles or positions. Preferably, these techniques are diffraction techniques. It is possible to use probing techniques where the probing beam is not stationary with respect to the surface of the sheet. One optical method uses a device commonly known as a speckle monitor in which the probe and the detector are stationary with respect to each other, and which measures the relative reflected intensity of a light beam directed at a surface that is not stationary, e.g. vibrating, with respect to the light beam and the detector.

Some suitable scanning techniques for probing the composition of the sheet use X-ray beam or electron beam excitation with detectors at appropriate positions. Those different techniques apply wavelength and energy dispersive analysis, and they are generally well known. Also, Rutherford Back Scattering, which uses an impinging ion beam, can be used to determine the oxygen content of the layer.

Each physical property has a different apparatus arranged to probe that property. The texture of a layer can be analysed, for example, by optical techniques, X-ray or neutron diffraction, or electron back scattering diffraction. These techniques are, generally, well-known and they may be used in parallel.

A flow diagram setting out the steps in the mapping process is shown in FIG. 5.

In a first step 11 of the mapping process, the probes in the probing chamber scan the whole of the surface of the sheet, or only a selected part of the surface. The former is located relative to the chamber, the probes by means of a series of position sensors which indicate the lateral position of the former relative to each probe, and the angular position of the former relative to the probing chamber. Each position sensor is connected to the processor to which it transmits signals. Therefore, the exact crystal grain structure, and configuration of grain boundary of the sheet can be determined and stored in the memory as an electronic file, the memory being connected to the processor. The map may also contain information about the location of defects present in the surface of the sheet.

In a second step 13 of the mapping process, the electronic file for each probe can be displayed on the screen as a map. Thus for each of a plurality of probes there is a map.

The map provides an image of the features of the surface of the layer as detected by the corresponding probe, each feature representing a variation of the physical property detected by that probe. The threshold values for each map of the sheet can be altered to indicate different properties indicative of a grain boundary. Therefore, a map may reveal the crystal structure, the location of the grain boundary, and the respective orientation of the grains. The maps, corresponding to different probes, when displayed as a visual representation may be colour coded for closer examination by the operator. Therefore, an operator can influence the probing by acting in response to the maps presented on the screen.

In a third step 15 of the mapping process, the maps of the sheet are combined to provide a composite map by means of algorithms contained in the software. The various maps are combined by weighting the value of each map relative to each other map. The weighting of each map is predetermined, but may be altered. Specific weighting values are used in different conditions, such as: with different materials in the sheet, and different forms and geometry of the former and the subsequent coil tracks, different positions in the coil and different final coil applications. The composite map identifies and locates each crystal grain boundary present within the sheet with greater accuracy than an map derived from a single probing method.

In its simplest form, the composite map will be formed by simple addition of the individual maps with weighting factors. In a more complex form, combinatorial versions will be used, for example, a term may be a multiplication product not an addition or subtraction.

Preferable probing techniques to probe the texture of a sheet include EBSD (Electron Back Scattering Diffraction), or optical analogues where, under chosen light conditions, the faceted structure of RABiTS and the grain boundaries are revealed. Thus, these techniques can be used to determine the grain boundaries.

Another suitable technique uses laser spot perturbation to probe the average relative angle of the facets of the crystal grain. One such device that uses this technique is known as a speckle monitor. In the speckle monitor an optical detector is used to detect laser light reflected from a sample, for example the sheet, held in vibrating machinery. The strength of the optical signal detected by the detector is dependent on the intensity of the reflected light. If the sheet were a single crystal facet the detected signal would not fluctuate. However, since the facets of the grains are orientated in different directions, the intensity of the reflected light, and consequently, the strength of the signal, changes greatly as the sheet vibrates. The detected signal therefore gives an indication of the orientation (or misorientation) of the crystal grains, the surface roughness, the degree of anisotropy of the crystal grains, and the size of the grains.

Note that the relative orientation of the grains is not necessarily obtained by simple optical microscopy techniques. The information obtained from these probes is used to determine the optimum lines for the edges to form the join as well as possible subsequent coil paths.

The microstructure of the join will critically determine the current for the subsequent overlying coils, as the join will inevitably be a source of a significant number of weak links and defects in the overlying coil. Therefore, an aim of mapping the sheet in the region of the edges to be joined enables the number of sources of weak links in the subsequent coils to be minimised.

In a fourth step 17, once a map has been obtained using the probe or the probes, it is stored in a memory that is connected to the processor, and it is displayed to user on visual display.

Once the map has been created, an optimum or preferred line for each of the edges to be joined is chosen or calculated. This line is calculated so that it substantially minimises the number of sources of defects or weak links encountered by the edges, and therefore avoids from including in the subsequently formed template areas in the sheet that would subsequently give rise to a poorly formed superconducting coil. It is also selected so that a track formed in a subsequently deposited layer has a super current that is substantially optimised. The maximum super current occurs where the direction of the current is not perpendicular to a definition of the texture in the superconducting layer, i.e. perpendicular to a crystal grain boundary. Therefore, the optimum line should minimise the number of grain boundaries that are perpendicular to the intended direction of the super current in a track formed in a subsequently deposited superconducting layer. The super current across a join is also optimised where the crystal grains on opposite sides of the edges to be joined have an interface that has a large overlapping cross-sectional surface area. Preferably, the interface has a large component of direction which is generally parallel to the direction of the super current.

For example, if the direction of the super current is perpendicular to the join, it is preferable for a substantial part of each of the pair of edges to have a component of direction that is perpendicular to the direction of the join, and parallel to the super current. Also, the component of the interface between the crystal grains in the opposing edges that form the join is large in the direction of the super current.

In calculating the optimum line, therefore, a number of possible lines are considered and calculated. Furthermore, three different factors, each on a different scale should be considered in calculating each optimum line, as well as the orientation of the crystal grains.

Firstly, the lines should be formed at positions in the sheet so that when the sheet is applied to the former, the edges defined by the preferred lines substantially meet. The edges may thus be joined. Thus, the distance between the lines are dependent on the circumference of the former, the shape of the former, the presence of a slot and the shape of the template. The scale of this factor is the size and shape of the sheet used to form the template.

Secondly, the lines should traverse substantially the minimum number of crystal grains. The lines should, therefore, follow the grain boundaries, and minimise the number of grain boundaries, as far as possible. However, because each edge defined by a line must fit with the edge defined by another line, in order for the two edges to form a good join, it is highly unlikely that both lines would follow only grain boundaries. The scale for this calculation is in the order of the size of the grains. As a consequence of this calculation, the locus of each line is substantially crenated. Each crenation substantially follows the boundary between the crystal grains. The crenations not only follow the crystal grain boundaries, but the are chosen to allow adjacent edges to interlock, once the lines are formed in the sheet. The order of magnitude of the interlocking component of the crenations is greater than the size of the crystal grains, but less than the width of a track to be formed in a subsequently deposited layer. Note that the size of the crenations is determined by the grain size, which for a RABiTS type material is generally much larger than for other texturing methods, for example using the IBAD technique.

Thirdly, when the formed edges are placed by each other, the alignment of the grains in the region of the sheet near each edge might not be same. The relative orientation may be slightly adjusted by moving one edge laterally with respect to the other. This might also improve the fit of the edges to each other.

Finally, the lines need to account for the preferred orientation of the crystal grains. If the grains are elongated and mutually aligned, the major axes of the elongate grains preferably align with the direction of a track to be formed in a subsequently deposited layer. As mentioned above, the mutual orientation of the grains, and the extent of overlap of the crystal grains in the interface between the pair of edges is an important consideration for the percolating current over a join, and the super current through a track, in a coil subsequently formed on the template. Therefore, the orientation of the crystal grains need to be accounted for in each of the three factors when calculating the optimum lines.

In selecting the optimum line, it is intended it optimise the join that is formed in the template, by way of considering these four factors: the size of the sheet, the size of the grains, the relative orientation of the edges, and the orientation of the grains relative to the sheet, and consequently the former.

In selecting the optimum lines, the shape of the crenations may be chosen to suit the application of the template, i.e. the coil to be formed on the template. The crenations are dentations, or toothed notches, along the edges to be joined. The crenations may be irregular; they may be regular; they may be similar; they may be periodic; they may be aperiodic; or a combination of these along the length of the edges. The extent of, for example, periodicity may be more apparent on a large scale, but on a small scale, the edges may be irregular and aperiodic. The crenations may specifically be serrations, crenulations, crenulations, or a combination of these. One preferred type of large scale regular, periodic crenated edge is serrated.

In selecting the shape and size of the crenations, the same considerations in choosing the optimum should be made. The shape of the crenations should minimise the number of crystal boundaries traversed. They should be chosen to minimise the number of grain boundaries that will be perpendicular in the direction of the super current passing through a track formed in a subsequently deposited layer. That is the percolating current in a track over the join must readily pass over the join. The component of the cross-sectional interface between the grains in opposing edges in the join in the direction of the super current should be optimised.

Also, the crenations can be altered to suit the shape of the crystal grains, for example they could suit mutually aligned elongate grains, or equiax grains. For elongate grains, the crenations may change shape as the line changes orientation with respect to the direction of the major axes of the grains, in order to minimise the number of crystal grains traversed. The shape of the crenations may appear regular, but on the scale of the crystal grains, the locus on the line may be irregular, in order to minimise the number of crystal grains traversed.

To assist the selection of the optimum lines, portions of the sheet in which the lines are proposed to be defined may be displayed on a screen. The representations of the sheet delineate the crystal boundaries in the sheet and the proposed lines. The images may be adjusted so that that images of the sheet move to overlie each other. The match of the optimised lines to each other, and the crystal boundaries in the sheet can be assessed. Different lines on the sheet may be viewed, so that the lines that have the best fit to each other and the crystal line boundaries may be selected as the optimum lines.

Instead of a visual selection of the line, the lines may be selected from all the possible calculated lines using an iterative computational method. The method is applied by a computer on a dataset that corresponds to the map. The optimum lines are selected to have substantially the minimum difference between their loci, to traverse substantially the minimum number of crystal grains, and to have the total length of the intersection of the grains traversed substantially minimised.

The former is then transferred to the joining chamber for cutting of one of, or both of, the edges and for joining the adjacent edges together to provide the template.

Figure 6:
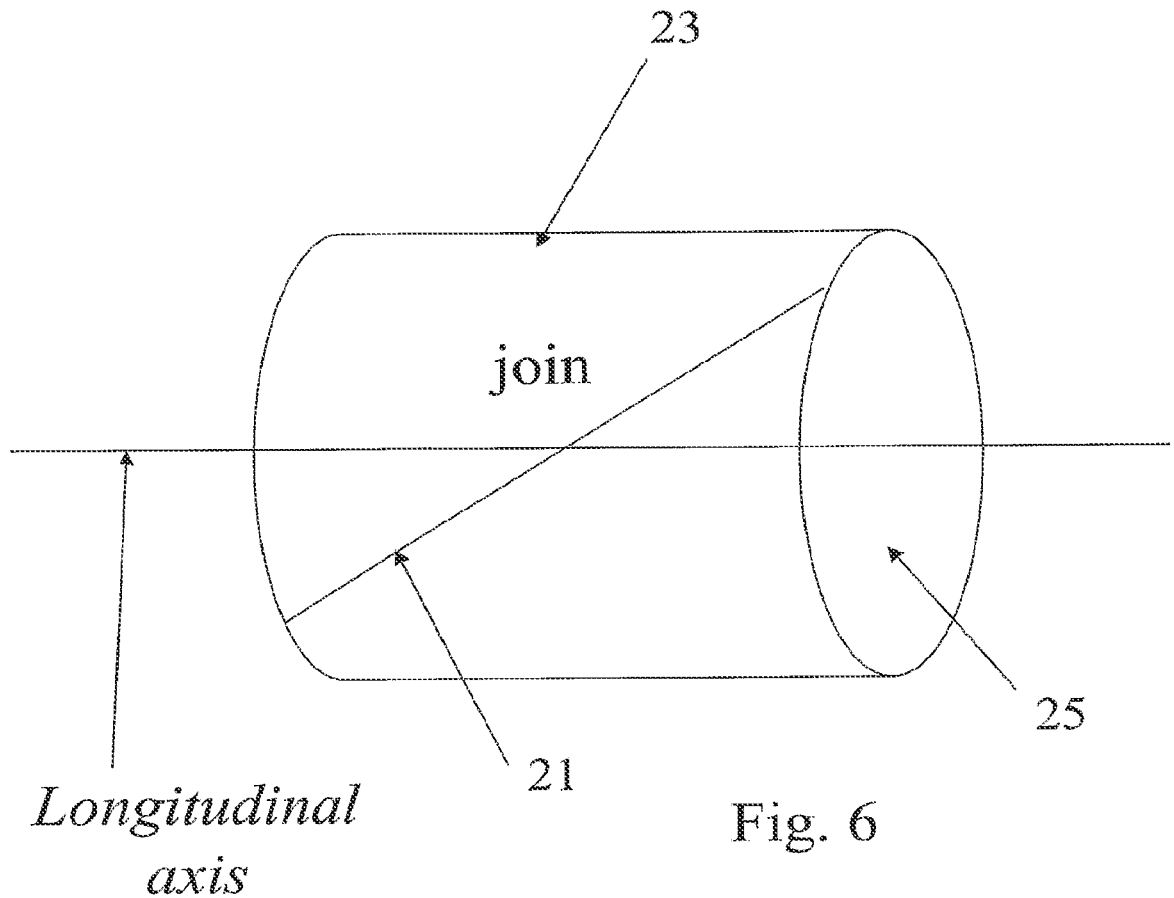
FIG. 6 is a schematic diagram of a sheet of RABiTS material fitted to a right circular cylindrical former to form a template.

After the join 21 has been made, as shown in FIG. 6, the sheet 23 is fitted to the former 25 to form a template, the former can be returned to the probing chamber. The join, and the regions of the sheet 23 either side of the join 21 are then probed to determine the quality of the join. This can be for a quality control step, or for the detection of defects which can be repaired by annealing, doping or other similar techniques. After a repairing step, the template may be probed again to map the join. Further repairing steps can be carried out and for each repairing step the mapping process is repeated.

Having mapped the surface texture of the sheet in the region of the join, the data can be used by the processor to calculate the paths of a coil track that could be formed when depositing subsequent superconducting layers to form a coil.

Sometimes the join is found to be of poor quality. If possible, the join can be improved or enhanced, by applying a "wallpapering" layer to the template, or the sheet undergoes an annealing or a doping process to repair the template in the region of the join.

Sometimes, however, the join is not repairable by "wallpapering", or it might be decided that the join should not be improved. The template may still be used to make a coil, by depositing an electrical shunt to connect subsequently deposited coil tracks either side of the join. A shunt is typically made of an alloy or metal such as gold or silver. It is usually applied in the manner of solder, in the location of the join where the connection is required. If can also be formed by placing a connecting wire interlinking the pair of edges together, where the wire may be forced between the edges. An interlinking thin film may be deposited between the edges. In another method of forming the shunt, a thick film is, for example, sprayed or painted, preferably through a mask, or printed across the join by an ink jet method. These methods may be accompanied by a heat treatment, for example, that melts of the wire, or the deposited film, to improve the join by, for example, filling it. At a join, there may be more than one shunt, for example there may be one shunt to underlie each crossing of the join by a subsequently deposited track.

Where a shunt is used to improve a join, the template is generally used to make a single layer superconducting coil, because the dimensions of the shunt are so large, i.e. an order of magnitude greater, with respect to the grains, that it would be a source for defects in subsequently deposited layers. Ultimately, the join will be a source of weak links in a superconducting coil subsequently formed on the template if that coil has tracks crossing the join. The texture across a join requiring a shunt is so poor that a track passing over the join would not superconduct. Therefore, the shunt needs to be thick in order to carry the required current.

Typically, the edge which is used to make a join will not, on a microscopic scale, be a straight line but have a crenated edge, for example, more specifically, a serrated edge. It would still have a general direction determined with respect to the axis of the cylindrical former. The serrations of each edge are generally prepared so that adjacent edges interlock with each other on a microscopic scale, in the manner of fitting jigsaw pieces together.

Figure 7:
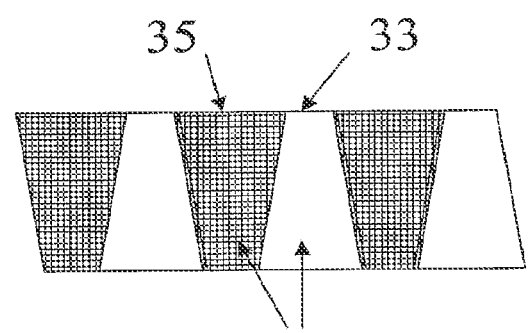
FIG. 7 is a schematic representation of dovetailed interlocks formed between two edges at a join.

In the preferred embodiment, the adjacent edges are prepared to be configured in the manner of multiple dovetailed joints. FIG. 7 shows inter-engaged dovetailed joints 31 for two edges 33, 35. These joints are shaped to take advantage of the grain elongation, thereby minimising both the number of adverse grain boundaries and the total area of those adverse grain boundaries. Simultaneously, the cross-sectional areas at the interface of the advantageous grain boundaries are maximised. The percolating current across a join is reduced where the join is perpendicular to the direction of the current. There is a minimal reduction in the current where the interface between the grains either side of the join are parallel to the percolating current. Thus the percolating current is maximised by this arrangement. To maximise the percolating current, the number of high angle grain boundaries in the join is also substantially minimised. However, for elongate grains, the optimum cross-sectional interface between grains in adjoining edges tends to occur if the elongate dimension of the grains is parallel to the edges. There is clearly a trade-off between the number of high angle grain boundaries and the area of the cross-sectional interface between grains in adjoining edges. This may be considered when calculating the optimum lines.

The precise configuration of the interlocking of the dovetailed joints in a pair of adjacent edges is dictated by the precise grain structure at the join. Thus the chosen or optimised line for the edges is determined by the mapping prior to the shaping of the adjacent edges.

The size of these dovetail style interlocking joints, with respect to both the grain boundary size and the width of subsequent superconducting tracks, is important. The dovetail interlocking joints can be much larger than the size of the grains. Ideally, they should be smaller than the width of the subsequent superconducting track, otherwise the "pitch" of the subsequently overlying superconducting coil tracks may interfere with the periodicity of the dovetailed joints and result in a large statistical fluctuation of percolation current at the join. For example, the eventual track width might be 5 mm, the dovetails might have a width of about 1 mm and the grain size might be about 200 microns in width. As described above, by using the map or maps derived from the probing process, it is possible to select a path for a good overall track. Thus, the processor uses the map to calculate the preferred location in the sheet to create the join.

Figure 8:
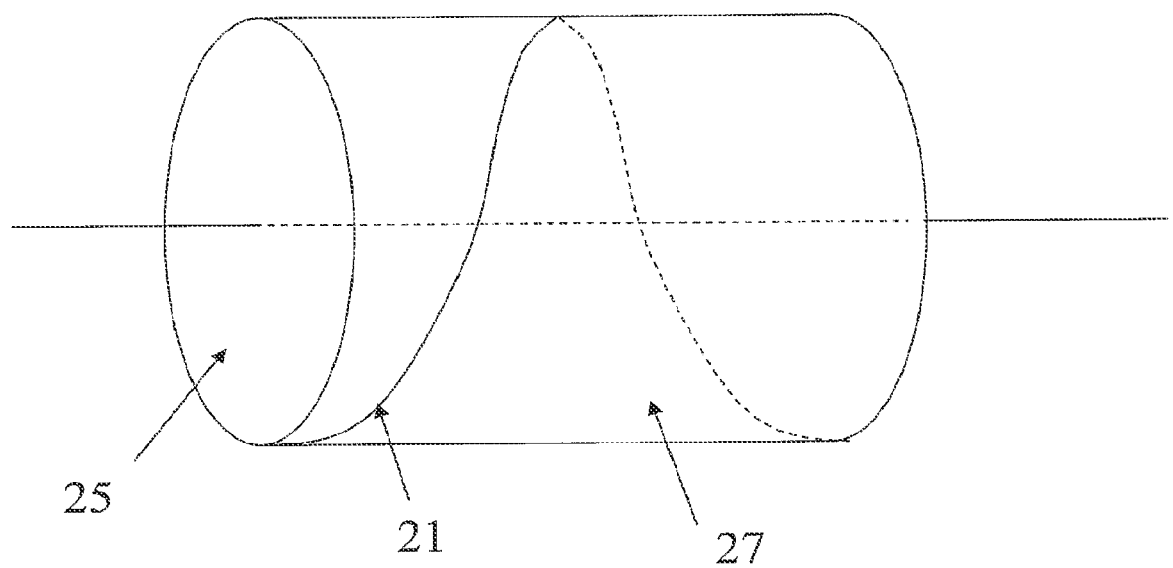
FIG. 8 is a schematic diagram of a template on a cylindrical former as shown in FIG. 6, where the join is distributed around the circumference of the cylinder.

As mentioned above, the join can have a general "direction" with reference to the cylindrical axis of the former. Since the join is likely to be a source of inhomogenity (in terms of the production of the resultant superconducting field produced by the subsequently deposited coil), it is preferable to distribute this inhomogenity around the circumference of the former in order to minimise it. That is, the join should not be parallel to the central axis of rotation. It could be a straight line as shown in FIG. 6, or it can have any configuration, for example a spiral, as shown in FIG. 8. FIG. 8 shows a template 27 formed on a cylindrical former 25, having a join 21 which travels around the circumference of the former 25. On the microscopic scale the join follows an arbitrary optimised line calculated in consequence of producing the map of the sheet, as shown in FIG. 3. The join formed following the line, once made, should allow a maximum percolation current to flow across this boundary. By distributing the join around the circumference of the cylindrical template made from the sheet, significant inhomogeneties that could develop in the produced magnetic field by the overlaid coil are prevented.

The rolling direction of RABiTS material is the direction in which the grains generally elongate. However, RABiTS materials can have equiax grains, where the grains are the same shape, and sometimes the same size. The uniformity in shape is achieved, even though the material is rolled, by doping, annealing and other techniques Eickemeyer et al., EUCAS2005 Vienna Austria, 10 to 15 Sep. 2005. Thus, the crystalline structure and orientation of a RABiTS material can be tailored to meet its specific application. The orientation in which the RABiTS sheet is wound around the cylinder, as well as the way it is cut, may then be chosen. The direction in which the grains are elongate in standard RABiTS materials gives the major direction in which the sheet is wrapped. The rolling direction should, therefore, line up with the paths, or tracks once formed, of the helical turns of the coil. Therefore, in each coil configuration the elongated grains in the sheet preferably lie parallel to the preferred direction of the coil tracks.

Figure 9:
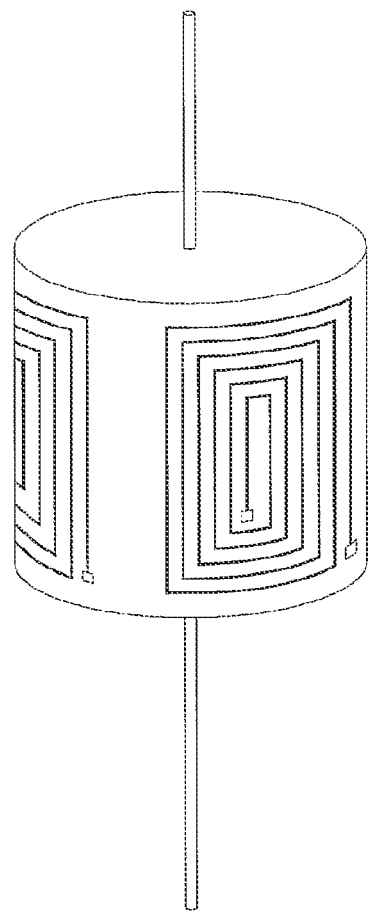
FIG. 9 is a schematic representation of a superconducting coil following a non-helical path, such coils may form the basis of a motor or a generator.

Choosing the orientation of the grains is useful in forming coils where the spiral track, although is not necessarily defined with reference to the longitudinal axis. Coils are usually shown to be wound around the longitudinal axis. However, an alternative coil configuration in which the axis of the coil is perpendicular to the longitudinal axis of the cylinder. This second coil configuration is more common for a motor coil configuration. The second coil configuration does not require each coil to pass around the rotational axis of the former or, indeed, for the turns of coil to be distributed around the whole axis of the former. In a preferred embodiment of a motor coil, the coil has three similar sized rotor coils equidistantly located on the surface of the former, as shown in FIG. 9.

In a coil, like that shown in FIG. 9, because the track does not pass around the whole circumference of the former, it is not necessary for the template to have a good quality join between those parts of the template on which a coil will subsequently be formed. These parts of the template can be connected by a shunt, because a coil track will not be formed across the join. In any event, a track across a join that is formed by a shunt will restrict the percolating current more than a track formed elsewhere on the template.

In another embodiment, it is not necessary to cover the whole surface of the former, if the coils to be subsequently formed on the template are to be separately connected to an electricity supply. For example, in the embodiment shown in FIG. 9, it is only necessary to have the template on the three parts of the former where a coil will subsequently be located. In such a template it is not necessary to join all parts of the template together, but to shape sheets to cover the part of the former where a coil is to be formed and to ensure that the relative grain orientation on the different sheets of the template have a predetermined mutual alignment.

After the making of the join, the join may have some defects, and it can be improved by smoothing or finishing over the template, or the shell, with subsequent layers thereby improving the microstructure in the vicinity of the join. This is commonly known as "wallpapering", "plastering", or "filling". Of course, this serves another purpose, in which this "wallpapering" layer, or "plastering" layer, acts as a buffer layer, preventing the migration of unwanted species, for example point defects or chemical species, between the superconducting layer deposited on top of the "wallpapering"

layer and the sheet, and vice versa. The quality of the microstructure and texture of the surface of the template after depositing a "wallpapering" layer can be assessed by mapping, or probing, that surface to form a map, as described above. YSZ is a particularly good material to use in the "wallpapering" "plastering" or "filling" layer, because it can be grown as a thick layer without losing texture; that is, it transmits most of the texture from the surface of the template to its own outer surface. It also has a reasonably good match with the ReBCO (e.g. YBCO) lattice parameter and expansion coefficient, which is typically used to make the overlying superconducting layer. By applying a "wallpapering" layer, in effect, the defects are overgrown, thereby removing their effect when the superconducting layer is grown on the textured YSZ surface.

Figure 10:
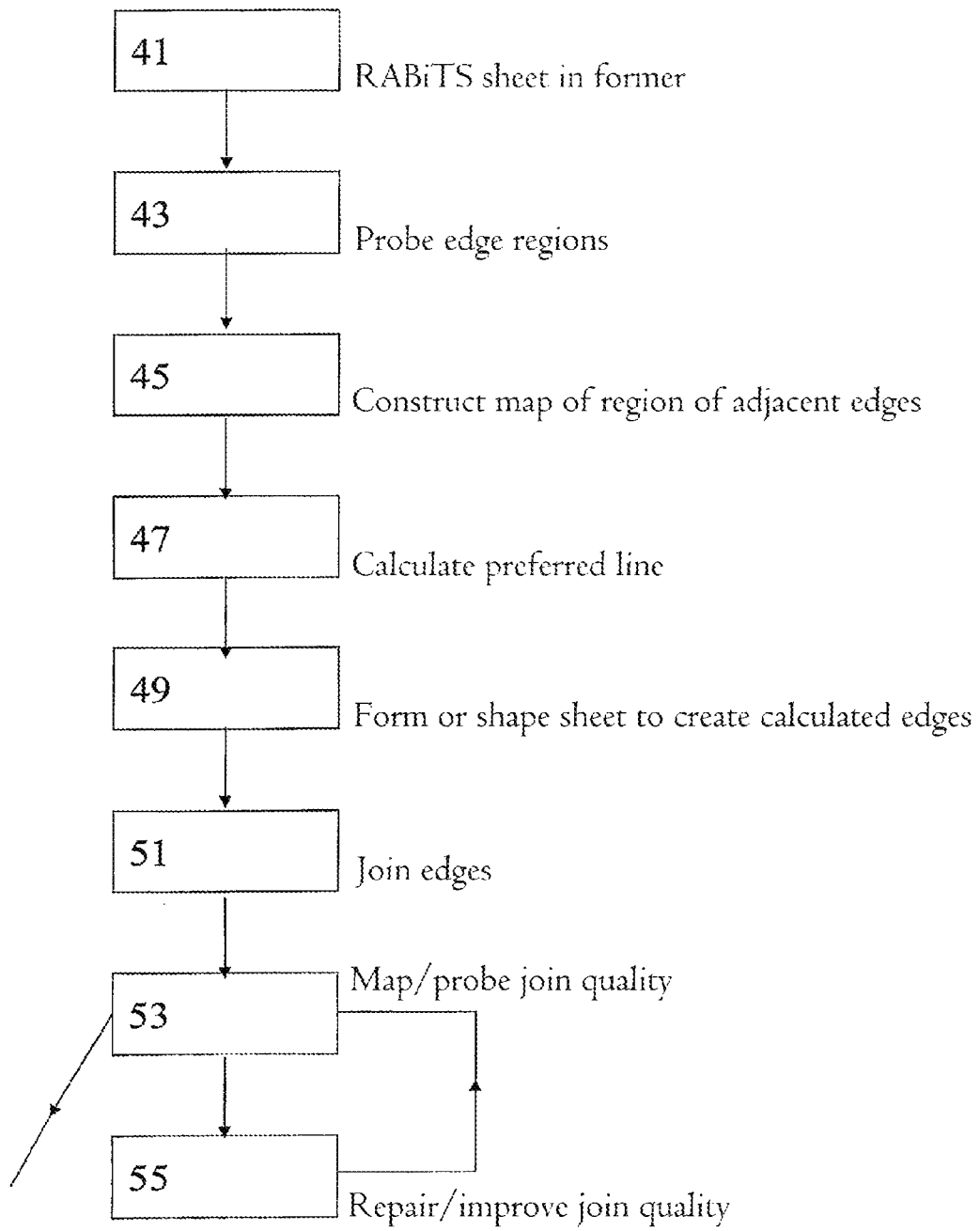
FIG. 10 is flow diagram of a process of making a template.

In the preferred embodiment of the invention the method would follow the steps shown in FIG. 10.

In a first step 41, a sheet of RABiTS material is taken and put on to a preliminary former.

In a second step 43, the regions of the sheet near the adjacent edges to be joined are probed in order to detect defects in the texture of the RABiTS sheet. Only those areas near the adjacent edges are probed; alternatively the entire sheet may be probed.

In a third step 45, the data produced by the probing is used to construct a map of the texture in the region of the adjacent edges.

In a fourth step 47, the map is used to calculate a preferred line of the adjacent edges avoiding the areas of poor texture and selecting a line that would permit a good percolation current in any subsequently deposited superconducting coils. That is the line, and its corresponding line, if defined into the sheet, would each form edges that: adjoin when the sheet is fitted to a former; fit each other; each substantially minimise the number of crystal grains they interest; and have grain orientations that, when the joining edges are place next to each other, are mutually aligned. If the defects in texture are too great, the lines are abandoned, and a new region of the sheet is probed to find a different pair of line along which a join can be formed. In a worse case scenario, the whole sheet would be abandoned. Steps two to four can be repeated until an adequate optimum line for each of the joining edges and the join is calculated.

In a fifth step 49, the sheet is formed or shaped to create the edges from the calculated preferred line of those edges.

In a sixth step 51, the shaped edges are joined.

In a seventh step 53, the join is mapped or probed in order to detect defects in the texture at, and in the region of, the join and to assess the quality of the join formed. If the join is too bad, the formed template or shell is abandoned.

In an eighth step 55, if the quality of the join can be improved or enhanced, a "wallpapering" layer is applied to the template or the sheet undergoes an annealing or a doping process to repair the template in the region of the join, to improve the quality of the join. The previous step is then carried out to determine the quality of the "wallpapering" of the layer in order to repair any further repairable defects in the texture of the template. These steps are repeated until the join is of a sufficient quality.

Figure 11:
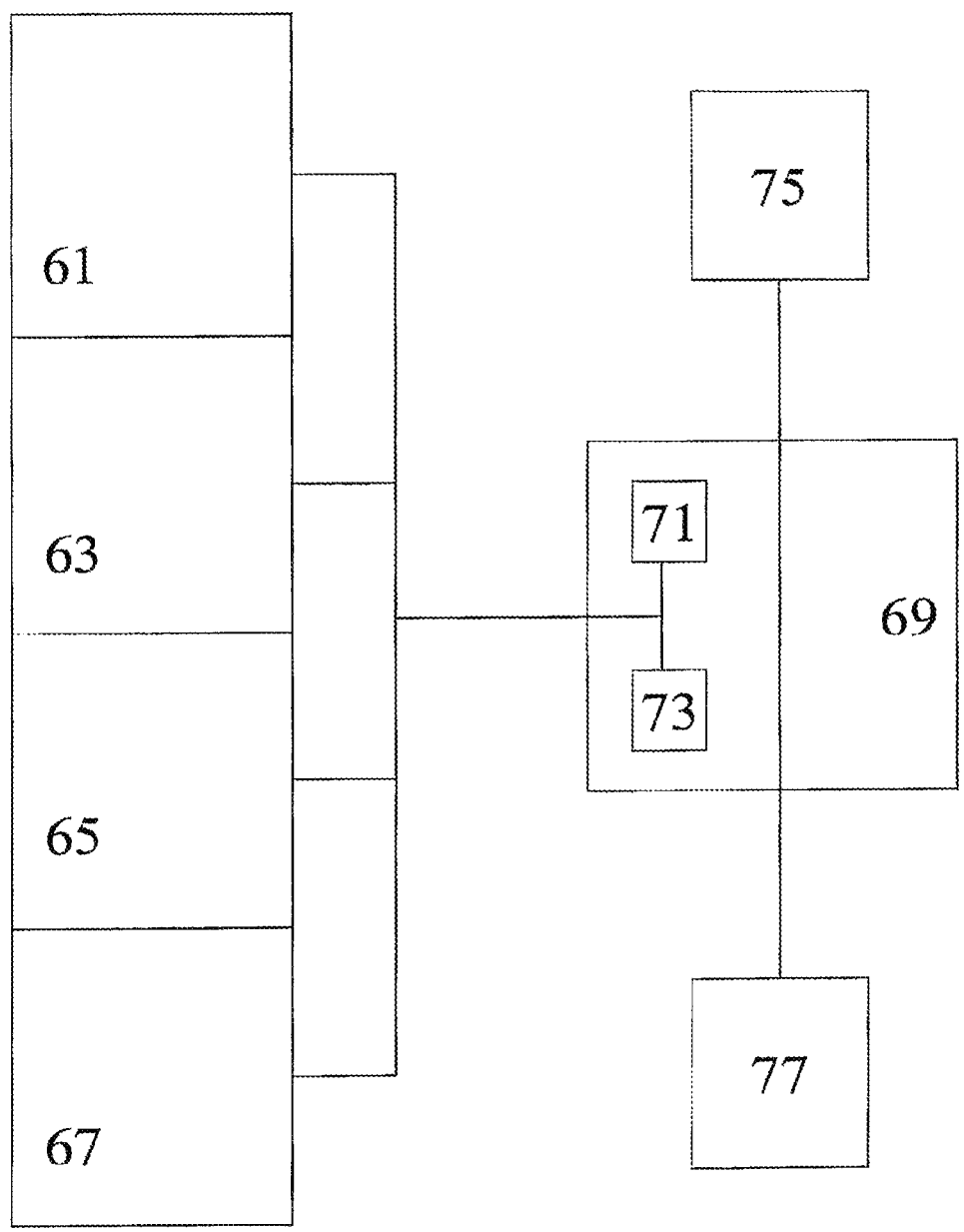
FIG. 11 is a schematic diagram of an apparatus for making a template.

In one form of the preferred embodiment, the process is entirely automated. This automated apparatus is shown in FIG. 11. The apparatus comprises a number of chambers which include: a probing chamber 61, a shaping chamber 63, a joining chamber 65 and a deposition chamber 67. The deposition chamber 67 is used to deposit the "wallpapering" layer on to the template. The shaping chamber 63 is used to define the chosen line of the edges in the sheet. The chambers and the tools within them are all connected to a computer 69 having a processor 71, a memory 73, a display screen 75 and operation devices 77 including a keyboard and a mouse. The operation of the computer 69 controls the progress of a sheet to through its manufacture to provide a template. The apparatus preferably follows the preferred process described above and as shown in FIG. 10.

In this preferred embodiment, a series of chambers are described, the template moving from one chamber to the next for a next step to be carried out on the template. This description is only by way of example. The different steps might be carried out in the same chamber, and in one embodiment of the invention, all the steps are carried out in a single chamber.

Having made the template a series of thin film coils can be formed in alternately superconducting layers and non-superconducting buffer layers. A full description of the methods and apparatus used to make such a superconducting coil is described in European Patent Application No. 02755238.9; and the methods and apparatus used to optimise the performance of the coil during its manufacture are described in European Patent Application No. 04717702.7. Essentially a motor or generator coil can be made, like that shown in FIG. 9.

In the coil shown in FIG. 9, the template is made of a RABiTS type material that has elongate crystal grains. The optimum performing motor or generator coil has a coil track substantially aligned with the orientation major axes of the mutually aligned crystal grains in the template. These crystal grains provide the surface texture on the template, which is subsequently copied through the subsequently deposited layers, thereby texturing these layers. By aligning the major axes of the elongate grains with the track direction, the percolating current is substantially optimised. Therefore, in making a template for a motor or a generator, there is an additional calculation step: the mean orientation of the major axes of the crystal grains in the sheet is chosen to align substantially with the direction of the track of a coil subsequently formed on the template. This will mean that the orientation of the grains in the sheet with respect to the former can be chosen. Also, the coils in these devices have helical tracks that can be: parallel to the rotational axis of a curved, preferably cylindrical, former along the length of the former; or perpendicular to the rotational axis of the former, around the circumference of the former. Another superconducting device that comprises a coil formed on a template is a fault current limiter (FCL). A resistive FCL is suited a template having elongate grains, and can be made in the manner of a motor or generator coil.

In an inductive FCL the coil is placed around a current carrying element, and the superconducting field created by the FCL screens the magnetic field created by the current carrying element. To provide this screening effect, the template on which the FCL coil is formed comprises equiax grains. Preferably the equiax grains are of similar size. The join formed in the template creates a discontinuity in the surface texture of the FCL, however, the does not substantially affect the effective screening performance of the FCL. The inductive FCL can be used anywhere where an inductive shielding element is required.

In a variation of these coils, the coil may comprise more than one template, where the templates are series of concentric shells of templates. Where the coil is generally right-circular-cylindrical in shape, the coil has a series of concentric cylindrical shells. A series of concentric shells would be used where the series of coil windings in the layers deposited on the first, inner template gradually accrue so many defects that a layer has to be abandoned. The second template is made to fit around the last deposited layer, and the coil fabrication process recommences until a layer is formed which is abandoned. The third template is then made to fit around the last deposited layer of the coil. This process is repeated until the desired coil has been fabricated.

In another embodiment, a new template made for the coil after a certain number of layers have been deposited. Thus, the templates can be pre-fabricated to certain dimensions in order to make the coil.

In a further embodiment, a combination of both methods can be used. For example templates of predetermined dimensions are prepared, but a new template is used only when the layers have accrued so many defects that a layer has to be abandoned. In a coil having a concentric shell of templates, most of the thickness of the coil will derive from the templates, because the templates are much thicker than the deposited layers, i.e. 30 to 50 µm rather than 1 µm.

The coils, once made can be fitted into a system, apparatus, or device where they are required. These systems may comprise only one superconducting coil, or many coils arranged in arrays, in series, in parallel or in any combination of these arrangements. Such systems and devices may include nuclear magnetic resonance apparatus, motors, generators, and FCLs, for example. Essentially, the coils can be fitted to any machine where a generator, motor, or FLC would be required.

To provide alternative embodiments, the apparatus and the method of the invention can be modified in a number of ways, some of which are described below.

More than one sheet of RABiTS material can be used to make the template, or the template.

Although the template formed from the sheet has to be made on a former, the sheet can be removed from the former after its manufacture.

The preferred embodiment refers to a cylindrical former. Any type of former with a curved surface can be used in addition to a right circular cylinder, for example a cone or a saddle. Of course the apparatus and process may need to be adapted to make a shell, or a template, having these shapes. It should be noted that normally the former would have an axis of rotational symmetry to facilitate the fabrication of the template, as well as the formation of a subsequently deposited coil.

In a preferred embodiment, the adjacent edges have to overlap to enable a good join to be made. However, the degree of overlap can be varied and in some circumstances the edges which are to be joined together can be arranged so that they meet at the join. One such method that achieves this is precision geometry using a "stencil" process. Initially the adjacent edges overlap once the sheet has been applied to the former. The first edge thus overlaps the region of the sheet near the second edge. This first edge is then used as a stencil to cut the new second edge so that they exactly match. This stencil cutting can be achieved by using a laser, etching methods or photoresist methods, for example.

Since the preferred embodiment uses a former with a bevelled depression, only one line need be defined in the sheet to form an edge. The edge can then be positioned over the underlying portion of the sheet at the overlap so that the edge is located above the position of the other line would be, if it were defined in the sheet to form the other edge of the pair of edges. The join is then formed with the edge in this position using any of the aforementioned joining methods, such as by thermo-mechanical means.

In another method, the join is formed with the edge being positioned at any location over the underling portion of the sheet at the overlap. However the quality of the join formed is of poorer quality than if the edge is located above the calculated position of the line in the underlying portion of the sheet if it were formed in the sheet.

In forming the join where there is an overlap of parts of the sheet, various welding and joining techniques can be used, some of which are described elsewhere in the specification. One suitable technique is friction welding which is a thermo-mechanical treatment. Pressure is applied to the sheet in the region of the overlap, for example by placing a roller over the overlap that frictionally applies pressure to the sheet. Heat is generated in consequence of the friction applied by the roller. The combination of the pressure and the heat causes the join to form.

Other suitable techniques include ion beam etching and electron beam etching. These techniques operate in the fine scale, as opposed to the larger scale of frictional welding. For example, in ion beam etching, the first edge is defined, and the second edge is cut using a laser beam, once the first edge is in position over the sheet. Greater control can be achieved using fine scale techniques than larger scale techniques, in forming the edges, and the join. For example, bevelled edges can be more easily formed using ion beam etching.

In one form of this method, the regions of the adjacent edges are first probed to provide a map. Once the preferred line of the adjacent edges has been calculated, the first edge is cut. To separate the two regions of the sheet from each other during cutting, a protective, or sacrificial, strip is inserted underneath the sheet in the region of the first edge and above the region of the sheet near the second edge. Once the first edge has been cut, the protective strip is removed, and the outline of the first edge is used as a stencil to cut the second edge. In cutting the second edge, a further sacrificial layer may be placed under the sheet in the region of the second edge. Once the second edge has been cut, or shaped, the two adjacent edges can be joined together using the techniques described above.

The preferred embodiment describes a former with a bevelled depression. Alternative types of former can be used. For example, the former can be springy so that on a compression of the sheet during making of the join, the former resiliently deforms under the compression applied. Thus, once the join has been made, the former reverts to its original form so that the surface of the template is substantially smooth and continuous.

In order to fit the sheet to the former, and optimise alignment of the joining edges of the join to be formed, the former may comprise device that deforms the shape of the former. For example, the former may be a circular cylinder, comprising a deformation device that includes a cam. On operation of the cam, before forming a join, the cross-sectional shape of the former is deformed into an ellipse, thereby stretching or compressing a sheet located on its surface. The relative position of the edges are thus moved to improve the quality of the join to be formed.

Another device to deform the former is, a spring located within the former that can be compressed to reduce the surface area of the former, or released to increase the surface area of the former. On operation of the device the edges of a sheet on the former will be moved relative to each other to enhance the join consequently formed.

In an alternative embodiment of the former, a slot is used instead of a depression. All four features can of course be used in combination in the former so it can be springy, have a slot, a depression and have a bevelled edge to the depression or slot or a combination of both of these features.

RABiTS tape is often prepared from rather wide sheets of RABiTS material. These wide lengths are cut up into individual strips in order to make the tape. Typically the tape is 4 to 10 mm wide, and the sheet (or band) is at least 6000 mm. The sheet is therefore one, nearly two, orders of magnitude greater in width than the tape.

The method described herein, is suitable for not just fabricating a template for a superconducting coil. It can also be used for joining sheets of RABITS type material together. One specific application is the joining of lengths of tape together, to form a long length of tape, having substantially continuous textured surface, and the grains in the tape being substantially aligned either side of each join. Thus lengths of tape having too many defects to be used for some applications can still be used, by removing the portion of the tape in which the defects are located.

In this specification, a RABiTS material includes all variations and modifications of this material, including RATS (Rolling Assisted Textured Substrate). A RATS material is rolled using rollers that are not parallel. A sheet of RATS material is therefore bent, i.e. curved.

The former can be adjustable so that the sheet, once fitted to it, forms a template having a desired shape.

In a variation of the preferred embodiment, the template is made from a sheet of material made by an IBAD type technique.

Figure 12:
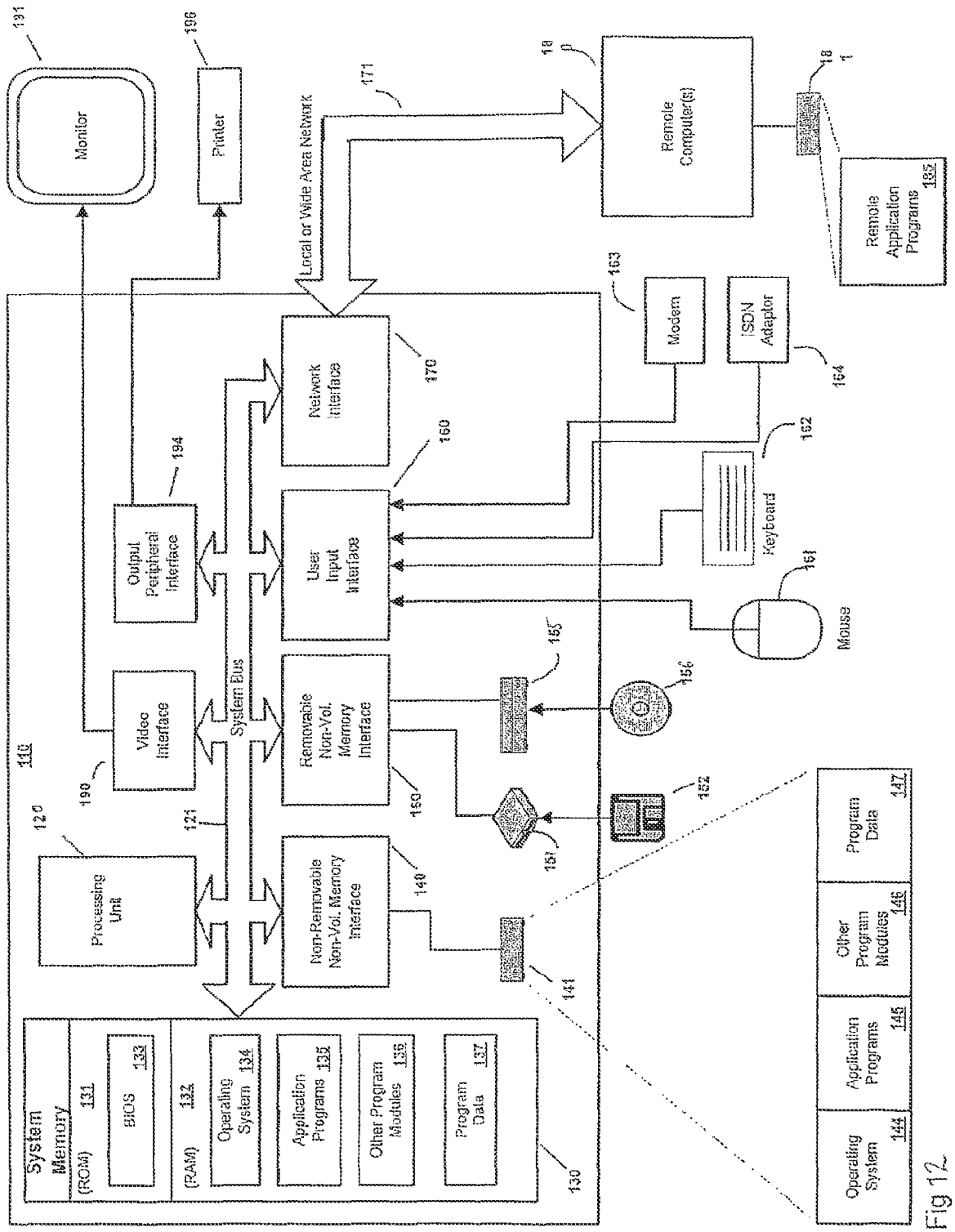
FIG. 12 is a schematic diagram of a computer environment for operating an automated apparatus used to make a template.

Operation of the automated apparatus is controlled by a computer 69. FIG. 12 illustrates an example of a suitable computer system environment 100 which may be used to operate the automated apparatus. The computing system environment 100 is only one example of a suitable computing environment and is not intended to suggest any limitation as to the scope of use or functionality of the automated apparatus. Neither should the computing environment 100 be interpreted as having any dependency or requirement relating to any one or combination of components illustrated in the exemplary operating environment 100.

The control of the automated apparatus may be described in the general context of computer-executable instructions, such as program modules, being executed by a computer. Generally, program modules include routines, programs, objects, components, data structures, and so forth, which perform particular tasks or implement particular abstract data types. Control of the apparatus may be achieved in distributed computing environments where tasks are performed by remote processing devices, for example in each of the chambers 61, 63, 65, 67 that are linked through a communications network. In a distributed computing environment, program modules may be located in local and/or remote computer storage media including memory storage devices.

With reference to FIG. 12, an exemplary system for implementing the invention includes a general purpose computing device in the form of a computer 69. Components of the computer 69 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computer 69 typically includes a variety of computer-readable media. Computer-readable media can be any available media that can be accessed by the computer 69 and includes both volatile and non-volatile media, and removable and non-removable media. By way of example, and not limitation, computer-readable media may comprise computer storage media and communication media. Computer storage media includes volatile and non-volatile, removable and non-removable media implemented in any method or technology for storage of information such as computer-readable instructions, data structures, program modules, or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computer 69. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless such as acoustic, RF, infrared and other wireless media.

Combinations of any of the above should also be included within the scope of computer-readable media.

The system memory 130 includes computer storage media in the form of volatile and/or non-volatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150. Floppy disk 152 is an example of a storage media which is read by the magnetic disk drive 151. Optical media DVD 156 is read by optical disk drive 155.

The drives and their associated computer storage media, discussed above and illustrated in FIG. 12, provide storage of computer-readable instructions, data structures, program modules and other data for the computer 69. In FIG. 12, for example, hard disk drive 141 is illustrated as storing operating system 144, application programs 145, other program modules 146 and program data 147. Note that these components can either be the same as or different from operating system 134, application programs 135, other program modules 136, and program data 137. Operating system 144, application programs 145, other program modules 146, and program data 147 are given different numbers herein to illustrate that, at a minimum, they are different copies. A user may enter commands and information into the computer 69 through input devices such as a keyboard 162 and pointing device 161, commonly referred to as mouse, trackball or touch pad. Devices such as Modem 163 and ISDN Adaptor 164 can be used to connect the computer to the public telephone network, in order to accept incoming calls, or dial out to $3^{rd}$ party people or computers. Other input devices not shown in FIG. 12 may include a tablet, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. The monitor 191 may also be integrated with a touch-screen panel or the like. Note that the monitor and/or touch screen panel can be physically coupled to a housing in which the computing device 69 is incorporated, such as in a tablet-type personal computer. In addition, computers such as the computing device 69 may also include other peripheral output devices such as a printer 196, which may be connected through an output peripheral interface 194 or the like.

The computer 69 may operate in a networked environment using logical connections to one or more remote computers, such as a remote computer 180, for example in the chambers 61, 63, 65, 67. The remote computer 180 may be a personal computer, a server, a router, a network PC, a peer device or other common network node, and typically includes many or all of the elements described above relative to the computer 69, although only a memory storage device 181 has been illustrated in FIG. 12. The connections shown in FIG. 12 depict either a local area network (LAN) or a wide area network (WAN) 171, but may also include other networks. Such networking environments are commonplace in offices, enterprise-wide computer networks, intranets and the Internet. For example, in the present invention, the computer system 69 may comprise a source machine from which data is being migrated, and the remote computer 180 may comprise the destination machine. Note however that source and destination machines need not be connected by a network or any other means, but instead, data may be migrated via any media capable of being written by the source platform and read by the destination platform or platforms.

When used in a LAN or WAN networking environment, the computer 69 is connected to the LAN or WAN 171 through a network interface or adapter 170.

In a networked environment, program modules depicted relative to the computer 69, or portions thereof, may be stored in the remote memory storage device. By way of example, and not limitation, FIG. 12 illustrates remote application programs 185 as residing on memory device 181. It will be appreciated that the network connections shown are exemplary and other means of establishing a communications link between the computers may be used.

The invention claimed is:

1. A method of making a superconducting coil in situ on a template on a former, the template being made from a sheet of flexible biaxially-textured material having at least two joining edges, the surface texture of the sheet being defined by a plurality of grains, the former having a substantially curved surface, the method comprising forming the template on the former and then forming the superconducting coil in situ on the template, the method of forming the template comprising:
shaping the sheet so that:
a) each joining edge lies adjacent to another joining edge on application of the sheet to the former, each joining edge and its adjacent edge being a pair of edges; and
b) the sheet is dimensioned to cover a part of the surface of the former and substantially to fit that part of the former;
positioning the sheet on the former so that regions of the sheet either side of the pair of edges have substantially aligned grains; and
forming a join between the pair of edges,
the template thereby having a substantially continuous textured surface across the join; and
the method of forming the superconducting coil on the template comprising forming a series of thin film coils on the template by forming alternate superconducting layers and non-superconducting buffer layers.

2. A method as claimed in claim 1, wherein the grains are substantially flat, elongate, mutually aligned crystal grains with mutually low-angled grain boundaries that have a crystalline c-axis substantially normal to the surface of the material, and the sheet is only one grain thick.

3. A method as claimed in claim 1, further comprising the step of probing the surface of the sheet for a physical property of the material comprising the sheet in order to detect variations in the physical property in the sheet.

4. A method as claimed in claim 3, wherein the step of probing the surface is restricted to the area of the surface only in the regions of the edges.

5. A method as claimed in claim 3, wherein the probing step comprises a plurality of probing steps, a different physical property of said material being probed during each probing step.

6. A method as claimed in claim 3, wherein each probing step provides a data set of a physical property of the sheet, each data set being processable to form a respective map, having features indicative of variations in the respective physical property over the sheet.

7. A method as claimed in claim 6, wherein each map is combined with one or more of the other maps to provide a composite map.

8. A method as claimed in claim 3, wherein the step of shaping the sheet comprises the step of calculating the optimum dimensions of the sheet, so that variations of the physical properties of the sheet, that are indicative of defects, are substantially minimised in each of the pair edges and in the regions of the sheet near the join, and, in the step of shaping the sheet, the sheet is shaped to the optimum dimensions.

9. A method as claimed in claim 8, wherein the calculation steps follow an iterative process.

10. A method as claimed in claim 3, wherein the step of shaping the sheet comprises the step of calculating an optimum line for each edge so that the lines of the pair of edges cooperate, each line traversing substantially the minimum number of grains, and, in shaping the sheet, each edge is defined by a line.

11. A method as claimed in claim 3, further comprising the step of calculating the optimum position of the sheet so that the grains at the edges of the pair of edges are substantially aligned, and the step of positioning the sheet further comprising, applying the sheet to the former in the optimum position.

12. A method as claimed in claim 3, further comprising the step of calculating the direction of a track to be formed in a subsequently deposited layer, so that the track substantially aligns with the orientation of the major axis of the grains.

13. A method as claimed in claim 3, further comprising the step of abandoning the whole of or part of the sheet if the variations in the physical properties of the sheet are indicative of too many defects being present in the whole or that part of the sheet for the sheet to provide a satisfactory template.

14. A method as claimed in claim 1, wherein, in the step of joining, a combination of pressure and heat treatments are applied to the sheet, whereby the regions of the sheet near the adjacent edges are secured to each other to form the join.

15. A method as claimed in claim 14, further comprising the step of fusing the edges together by annealing and/or heat treatment to form the join, thereby improving the quality of the join by repairing defects present.

16. A method as claimed in claim 15, wherein the joining step further includes a doping step, thereby further improving the quality of the join by repairing any defects present.

17. A method as claimed in claim 1, wherein regions of the sheet near the adjacent edges overlap, and the joining step includes perforating the regions of the sheet near the adjacent edges to define the cut through the overlapping regions.

18. A method as claimed in claim 1, wherein regions of the sheet near the adjacent edges overlap, and the joining step includes a chemical, plasma or ion beam etching or electroforming process to etch the overlapping regions.

19. A method as claimed in claim 1, further comprising the step of probing the regions of the template either side of the join to assess the quality of the join.

20. A method as claimed in claim 1, further comprising a repairing step during which the sheet undergoes a treatment to improve the quality of the join.

21. A method as claimed in claim 20, wherein the treatment includes annealing and/or doping and/or a thermo-mechanical treatment.

22. A method as claimed in claim 20, wherein the treatment includes depositing at least one buffer layer on the template.

23. A method as claimed in claim 1, wherein, in the step of shaping the sheet, at least one of the pair of edges is crenated, thereby maximising the percolation current around the subsequently deposited coil.

24. A method as claimed in claim 23, wherein both edges of the pair are crenated and are arranged to interlock.

25. A method as claimed in claim 24, wherein the crenations along the pair of edges may each have a dovetail configuration with each crenation being dovetail-shaped, substantially larger than the size of the grains present in the sheet but substantially less than the width of a track to be formed in a subsequently deposited layer, the edges of the pair of edges being mutually-interlockable.

26. A method as claimed in claim 23, wherein the crenations are similar in shape and periodic along the edge.

27. A method as claimed in claim 1, wherein the pair of edges meet to form a join along a longitudinal axis of the former to maximise percolation current around the subsequently deposited coil.

28. A method as claimed in claim 27, wherein the join passes substantially around the circumference of the former.

29. A method as claimed in claim 1, further comprising placing the sheet around the former with elongated crystals grains substantially in the direction of the turns of a subsequently-deposited coil.

30. A method as claimed in claim 1, wherein the material used to make the sheet is made of a RABiTS material.

31. A method as claimed in claim 1, wherein the former is substantially cylindrical.

32. A method as claimed in claim 1, wherein in the joining step an electrical shunt is formed between the edges of the pair of edges.

33. A method as claimed in claim 1, wherein when positioning the sheet on the former the regions either side of the edges overlap.

34. A method of making a superconducting coil in situ on a template on a former, the template being made from a sheet of flexible biaxially-textured material having at least two edges, the surface texture of the sheet being defined by a plurality of grains, the former having a substantially curved surface, the method comprising forming the template on the former and then forming the superconducting coil in situ on the template, the method of forming the template comprising:
    shaping the sheet so that:
        a) each edge lies adjacent another of the edges on application of the sheet to the former, each edge and its adjacent edge being a pair of edges; and
        b) the sheet is dimensioned to cover a part of the surface of the former and substantially to fit that part of the former; and
    positioning the sheet on the former so that regions of the sheet either side of the pair of edges have substantially aligned grains,
    the template thereby having a substantially continuous textured surface between the regions of the sheet either side of the pair of edges; and
    the method of forming the superconducting coil on the template comprising forming a series of thin film coils on the template by forming alternate superconducting layers and non-superconducting buffer layer.

35. A method of making a superconducting coil in situ on a multi-component template on a former, the template being made from at least two sheets of flexible biaxially textured material, each sheet having a plurality of edges, the features of each sheet being defined by a plurality of substantially orientated grains, the former having a substantially curved surface, the method comprising forming the template on the former and then forming the superconducting coil in situ on the template, the method of forming the template comprising:
    shaping each sheet to cover a part of the surface of the former;
    positioning and securing each sheet on the surface of the former at a pre-selected location with respect to the or each other sheet, the grains of each sheet being mutually aligned and having a predetermined orientation with respect to the alignment of the grains of the/each other sheets; and
    the method of forming the superconducting coil on the template comprising forming a series of thin film coils on the template by forming alternate superconducting layers and non-superconducting buffer layer.

36. A method as claimed in claim 35, further comprising the step of calculating the shape of the sheet and the pre-selected location of the sheet on the former.

37. A computer readable storage medium storing a computer program or at least one of a suite of computer programs arranged such that when executed by a computer the program or programs operate the computer to control an apparatus to perform the method of claim 1.

* * * * *

UNITED STATES PATENT AND TRADEMARK OFFICE
CERTIFICATE OF CORRECTION

PATENT NO. : 8,745,849 B2  
APPLICATION NO. : 12/094940  
DATED : June 10, 2014  
INVENTOR(S) : Maher Page 1 of 1

It is certified that error appears in the above-identified patent and that said Letters Patent is hereby corrected as shown below:

On the title page, item (73) Assignee, please delete "Coated Conductor Cylinders Ltd." and replace with --3-CS Ltd--.

Signed and Sealed this
Fourteenth Day of April, 2015

Michelle K. Lee
*Director of the United States Patent and Trademark Office*